(12) United States Patent
Tzeng et al.

(10) Patent No.: US 12,106,598 B2
(45) Date of Patent: Oct. 1, 2024

(54) FINGERPRINT SENSING DEVICE

(71) Applicant: Au Optronics Corporation, Hsinchu (TW)

(72) Inventors: Shu-Wen Tzeng, Hsinchu (TW); Yan-Liang Chen, Hsinchu (TW); Jui-Chi Lo, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 550 days.

(21) Appl. No.: 17/355,202

(22) Filed: Jun. 23, 2021

(65) Prior Publication Data
US 2022/0050988 A1    Feb. 17, 2022

Related U.S. Application Data

(60) Provisional application No. 63/066,391, filed on Aug. 17, 2020.

(30) Foreign Application Priority Data

Jan. 26, 2021   (TW) ................................ 110102833

(51) Int. Cl.
| | | |
|---|---|---|
| G06V 40/13 | (2022.01) | |
| H10K 59/124 | (2023.01) | |
| H10K 59/131 | (2023.01) | |
| H10K 59/40 | (2023.01) | |

(52) U.S. Cl.
CPC ....... *G06V 40/1318* (2022.01); *H10K 59/124* (2023.02); *H10K 59/131* (2023.02); *H10K 59/40* (2023.02)

(58) Field of Classification Search
CPC ........ H10K 59/40; H10K 59/60; H10K 59/65; H10K 10/88; H10K 30/88;
(Continued)

(56) References Cited

U.S. PATENT DOCUMENTS

| 8,072,060 B2 | 12/2011 | Chou |
| 9,553,062 B1 | 1/2017 | Fan et al. |

(Continued)

FOREIGN PATENT DOCUMENTS

| CN | 103513459 | 1/2014 |
| CN | 106022324 | 10/2016 |

(Continued)

*Primary Examiner* — Amr A Awad
*Assistant Examiner* — Aaron Midkiff
(74) *Attorney, Agent, or Firm* — JCIPRNET

(57) ABSTRACT

A fingerprint sensing device has a sensing area, an operation area, and a peripheral area, and the operation area is disposed between the sensing area and the peripheral area. The fingerprint sensing device includes a substrate, a sensing element located at the sensing area, an operation element located at the operation area, a first signal line located at the peripheral area, a first planarization layer, a first insulating layer, and a first shading layer. The first planarization layer is located on the substrate and has a first trench, and the first trench overlaps the first signal line. The first insulating layer is located on the first planarization layer and in the first trench, and the first insulating layer has a first opening located in the first trench. The first shading layer is located on the first insulating layer and connected to the first signal line through the first opening.

7 Claims, 18 Drawing Sheets

(58) Field of Classification Search
CPC . H10K 50/84–846; H10K 59/87–8794; G06V 40/12–1394; G06V 40/00–70; G06F 21/32; G06F 2203/04107; G06F 3/041–04897; G06F 18/00; H01L 27/0248; H01L 2224/02372; H01L 2224/48227; H01L 2224/8111; H01L 2224/8211; H01L 2224/8311; H01L 2224/8411; H01L 2224/8511; H01L 2224/8611; H01L 27/146–14698; H01L 21/76–76898; B81B 7/0064; G02F 1/133334; G02F 1/136204

See application file for complete search history.

(56) References Cited

U.S. PATENT DOCUMENTS

| | | | |
|---|---|---|---|
| 9,946,915 | B1 | 4/2018 | Troccoli et al. |
| 10,438,044 | B2 | 10/2019 | Wu et al. |
| 2006/0183265 | A1 | 8/2006 | Oh et al. |
| 2010/0096710 | A1 | 4/2010 | Chou |
| 2012/0086094 | A1* | 4/2012 | Watanabe .......... H01L 27/1464 257/E31.127 |
| 2015/0264233 | A1 | 9/2015 | Chien et al. |
| 2016/0093645 | A1 | 3/2016 | Lee et al. |
| 2018/0107856 | A1 | 4/2018 | Troccoli et al. |
| 2019/0026530 | A1 | 1/2019 | Wu et al. |
| 2019/0229220 | A1* | 7/2019 | Tazoe ....................... G06T 7/55 |
| 2020/0193126 | A1* | 6/2020 | Shi ................... G02F 1/136286 |
| 2021/0257577 | A1* | 8/2021 | Bang ...................... H10K 59/40 |
| 2021/0273017 | A1* | 9/2021 | Murata ............ H01L 27/14621 |

FOREIGN PATENT DOCUMENTS

| | | |
|---|---|---|
| CN | 109116608 | 1/2019 |
| TW | 201017554 | 5/2010 |
| TW | M519281 | 3/2016 |
| TW | 201814879 | 4/2018 |

* cited by examiner

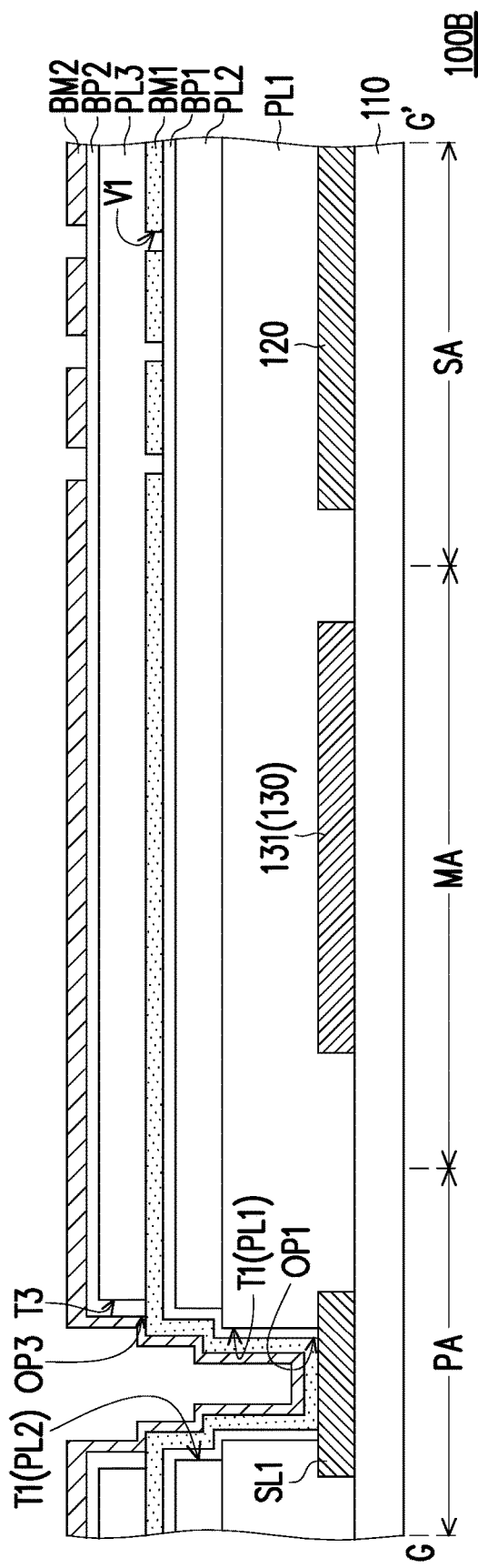
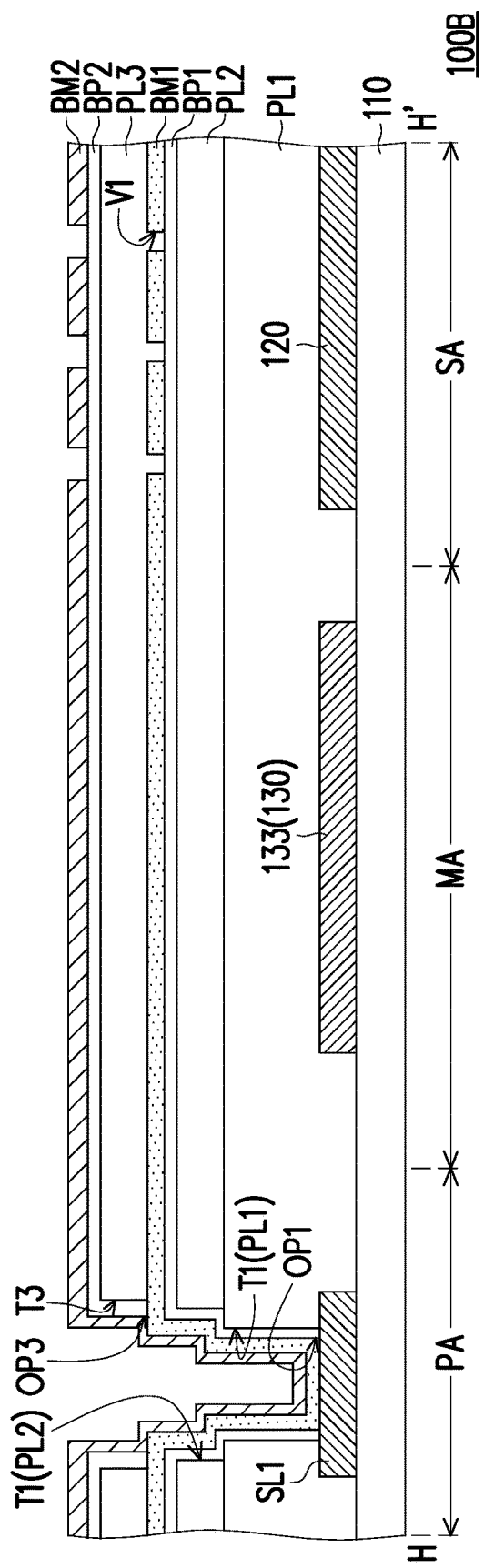

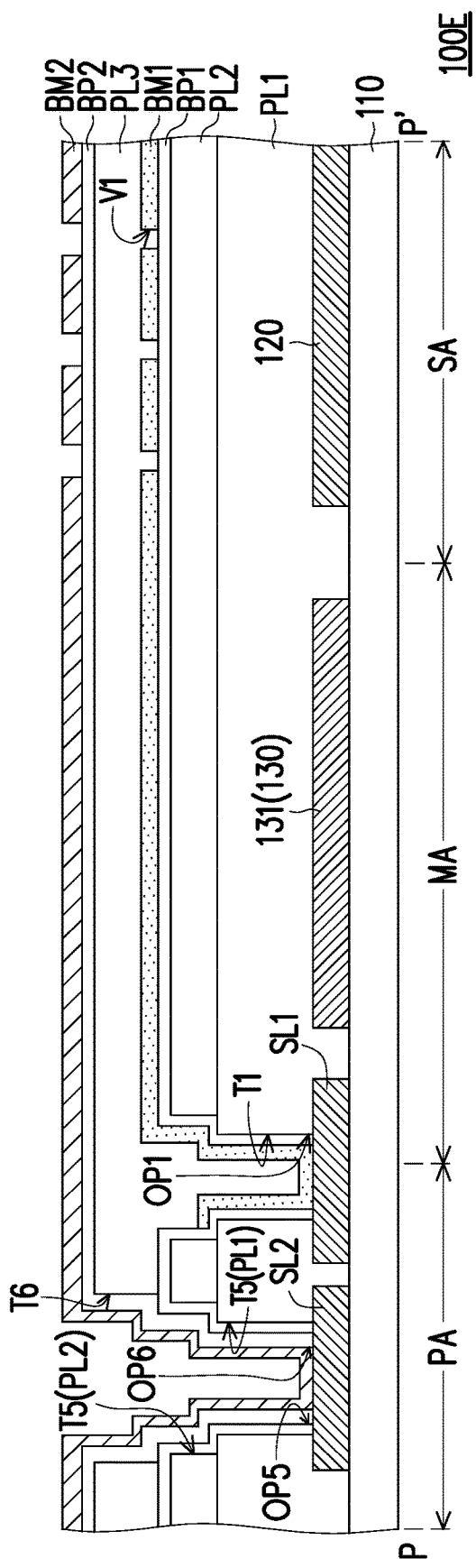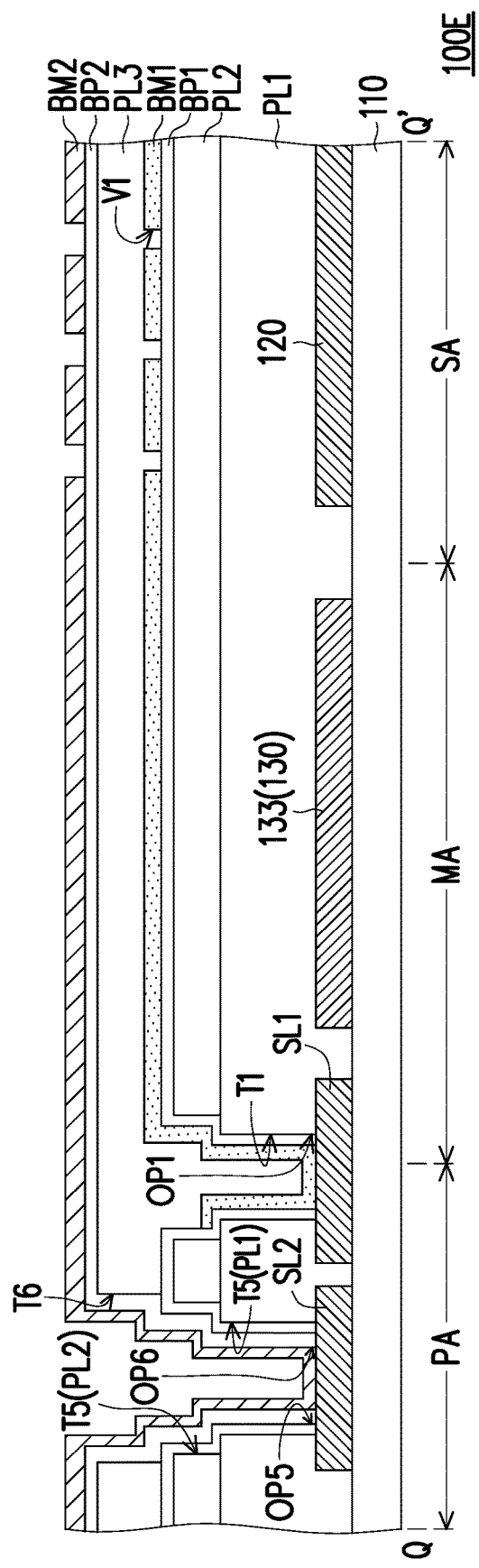

FINGERPRINT SENSING DEVICE

CROSS-REFERENCE TO RELATED APPLICATION

This application claims the priority benefit of U.S. provisional application Ser. No. 63/066,391, filed on Aug. 17, 2020, and Taiwan patent application serial no. 110102833, filed on Jan. 26, 2021. The entirety of each of the above-mentioned patent applications is hereby incorporated by reference and made a part of this specification.

BACKGROUND

Technical Field

The disclosure relates to a fingerprint sensing device; more particularly, the disclosure relates to a fingerprint sensing device with anti-moisture and anti-electrostatic discharge (anti-ESD) capabilities.

Description of Related Art

A fingerprint recognition function may be performed through and supported by a variety of application programs, which may enhance user experience and add values, so that such a function is one of the key development projects in the industry at present. To improve fingerprint recognition, in the existing fingerprint sensing devices, it is necessary to stack organic materials for providing sufficient thickness to facilitate microlens focusing effects and light collimation, whereby clear fingerprint images may be obtained. However, high moisture absorption abilities of the organic materials may lead to the increasing risk of corroding conductive wires and even abnormal operation of the fingerprint sensing devices.

In addition, the existing fingerprint sensing devices have a single circuit board and are not equipped with metal frames, and thus the existing fingerprint sensing devices do not have any anti-ESD structure.

SUMMARY

The disclosure provides a fingerprint sensing device which features anti-moisture and anti-ESD capabilities.

According to an embodiment of the disclosure, a fingerprint sensing device having a sensing area, an operation area, and a peripheral area is provided, wherein the operation area is located between the sensing area and the peripheral area. The fingerprint sensing device includes a substrate, a sensing element located at the sensing area, an operation element located at the operation area, a first signal line located at the peripheral area, a first planarization layer located on the substrate and having a first trench, a first trench overlapping the first signal line, a first insulating layer located on the first planarization layer and in the first trench and having a first opening, and a first shading layer located on the first insulating layer and connected to the first signal line through the first opening. Here, the first opening is located in the first trench.

In an embodiment of the disclosure, the operation element includes a driving element and a testing element.

In an embodiment of the disclosure, the first planarization layer includes an organic material.

In an embodiment of the disclosure, the first insulating layer includes an inorganic material.

In an embodiment of the disclosure, the first opening overlaps the first signal line.

In an embodiment of the disclosure, the first shading layer includes a metal layer and a transparent oxide layer, and the metal layer includes an aluminum layer, a molybdenum layer, a titanium layer, or a combination thereof.

In an embodiment of the disclosure, the first signal line is a grounded line or a direct current power line.

In an embodiment of the disclosure, the first planarization layer further has a second trench, and the second trench is located between the first trench and the operation element. The first insulating layer further has a second opening, and the second opening is located in the second trench. The first shading layer is located in the second opening.

In an embodiment of the disclosure, the fingerprint sensing device further includes a third planarization layer, a second insulating layer, and a second shading layer sequentially on the first shading layer, wherein the third planarization layer has a third trench overlapping the first trench, the second insulating layer has a third opening located in the third trench, and the second shading layer is connected to the first shading layer through the third opening.

In an embodiment of the disclosure, the first planarization layer further has a second trench located between the first trench and the operation element, the first insulating layer further has a second opening located in the second trench, and the first shading layer is located in the second opening.

In an embodiment of the disclosure, the fingerprint sensing device further includes a fourth planarization layer, a third insulating layer, a fifth planarization layer, a fourth insulating layer, a third shading layer, and a microlens structure sequentially on the second shading layer, wherein the fourth planarization layer, the third insulating layer, and the fifth planarization layer have a fourth trench overlapping the third trench, the fourth insulating layer has a fourth opening located in the fourth trench, and the third shading layer is connected to the second shading layer through the fourth opening.

In an embodiment of the disclosure, the third shading layer has a third through hole, and the microlens structure is disposed in the third through hole.

In an embodiment of the disclosure, the third shading layer includes a metal layer and a transparent oxide layer.

In an embodiment of the disclosure, the fingerprint sensing device further includes a second signal line, and further includes a third planarization layer, a second insulating layer, and a second shading layer sequentially on the first shading layer, wherein the first signal line is located between the second signal line and the operation element, the first planarization layer further has a fifth trench overlapping the second signal line, the first insulating layer further has a fifth opening located in the fifth trench, the third planarization layer has a sixth trench overlapping the fifth trench, the second insulating layer has a sixth opening located in the fifth opening, and the second shading layer is connected to the second signal line through the sixth opening.

In an embodiment of the disclosure, the first shading layer includes a metal layer and a transparent oxide layer.

In an embodiment of the disclosure, the second shading layer includes a metal layer and a transparent oxide layer.

In an embodiment of the disclosure, the second signal line is a grounded line or a direct current power line.

In an embodiment of the disclosure, the fingerprint sensing device is adapted to a display device, wherein the sensing element is located between the display device and the substrate.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3E is a schematic cross-sectional view taken along a sectional line G-G' in FIG. 3A.

FIG. 3F is a schematic cross-sectional view taken along a sectional line H-H' in FIG. 3A.

FIG. 6B is a schematic cross-sectional view taken along a sectional line P-P' in FIG. 6A.

FIG. 6C is a schematic cross-sectional view taken along a sectional line Q-Q' in FIG. 6A.

DESCRIPTION OF THE EMBODIMENTS

Figure 1A:
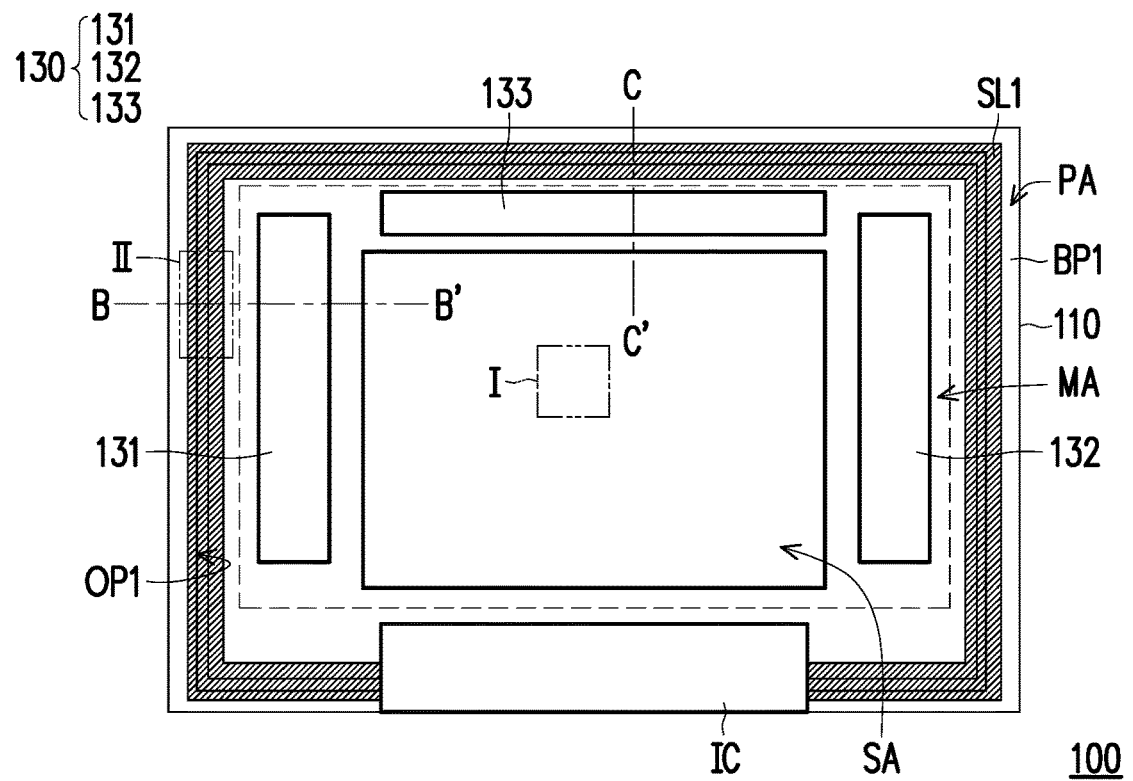
FIG. 1A is a schematic top view of a fingerprint sensing device 100 according to an embodiment of the disclosure.
Figure 1B:
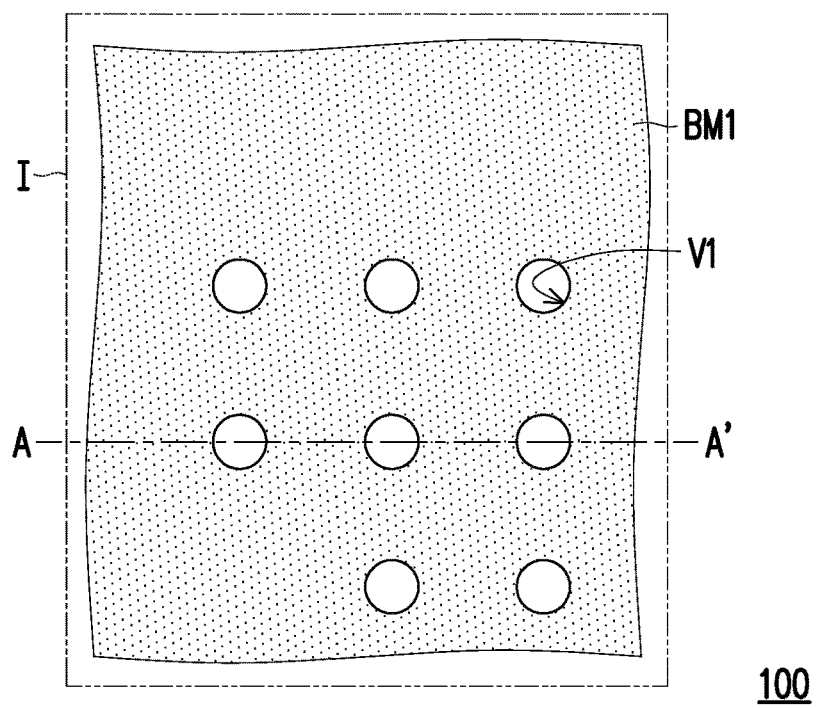
FIG. 1B is a schematic enlarged view of an area I in the sensing area SA of the fingerprint sensing device 100 depicted in FIG. 1A.
Figure 1C:
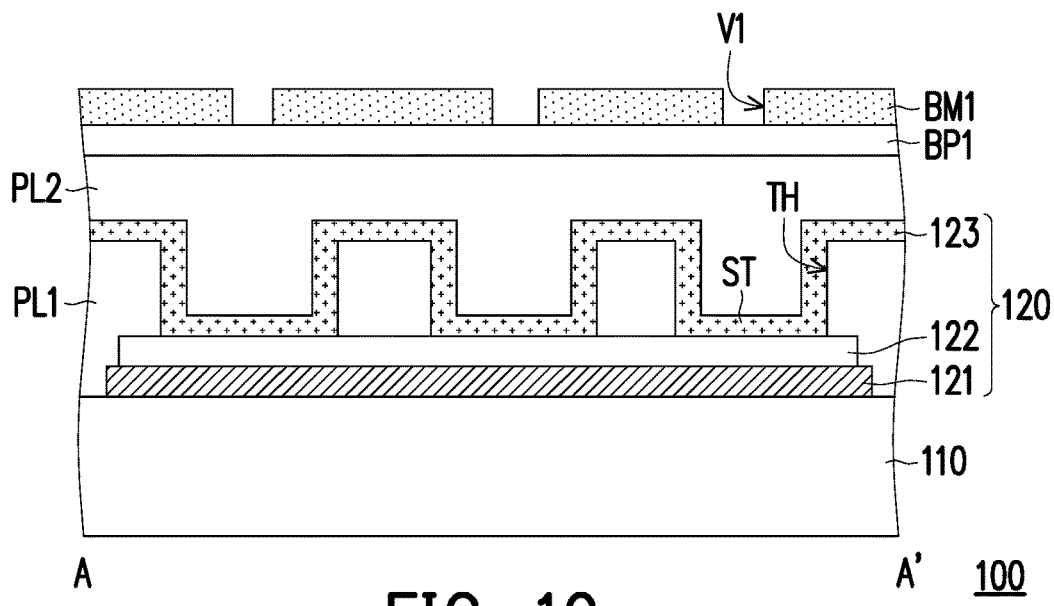
FIG. 1C is a schematic cross-sectional view taken along a sectional line A-A' in FIG. 1B.
Figure 1D:
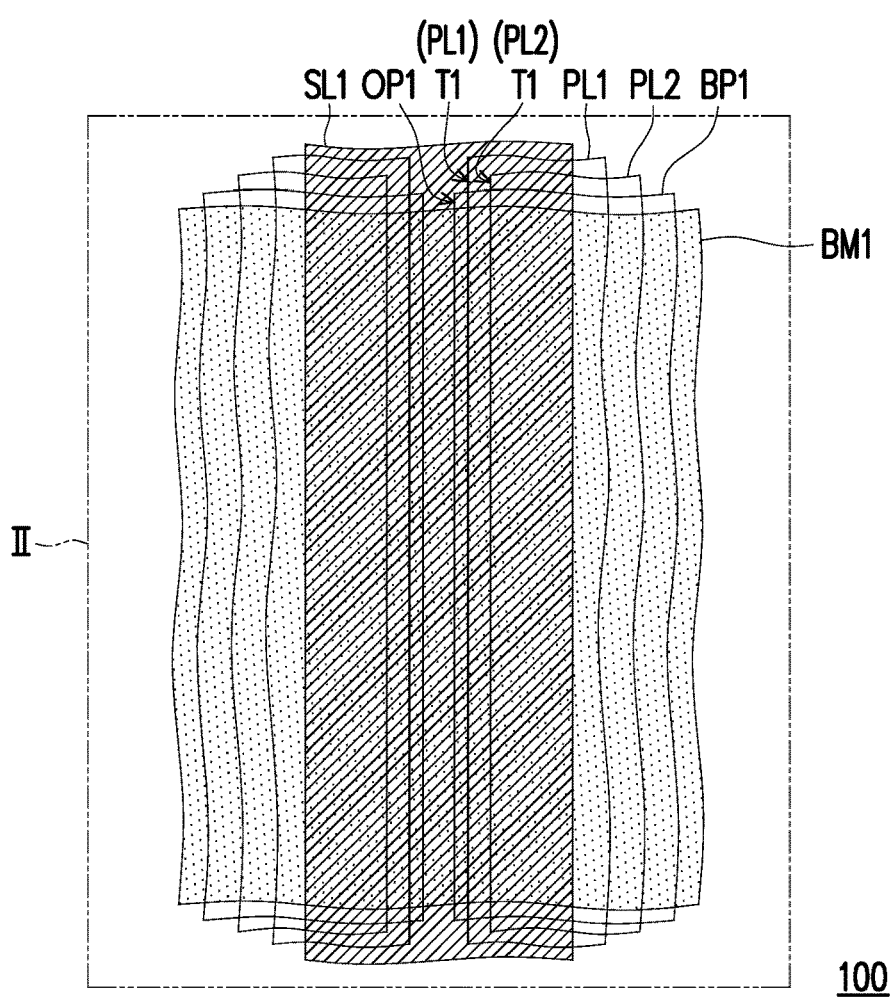
FIG. 1D is a schematic enlarged view of an area II in the peripheral area PA of the fingerprint sensor device 100 depicted in FIG. 1A.
Figure 1E:
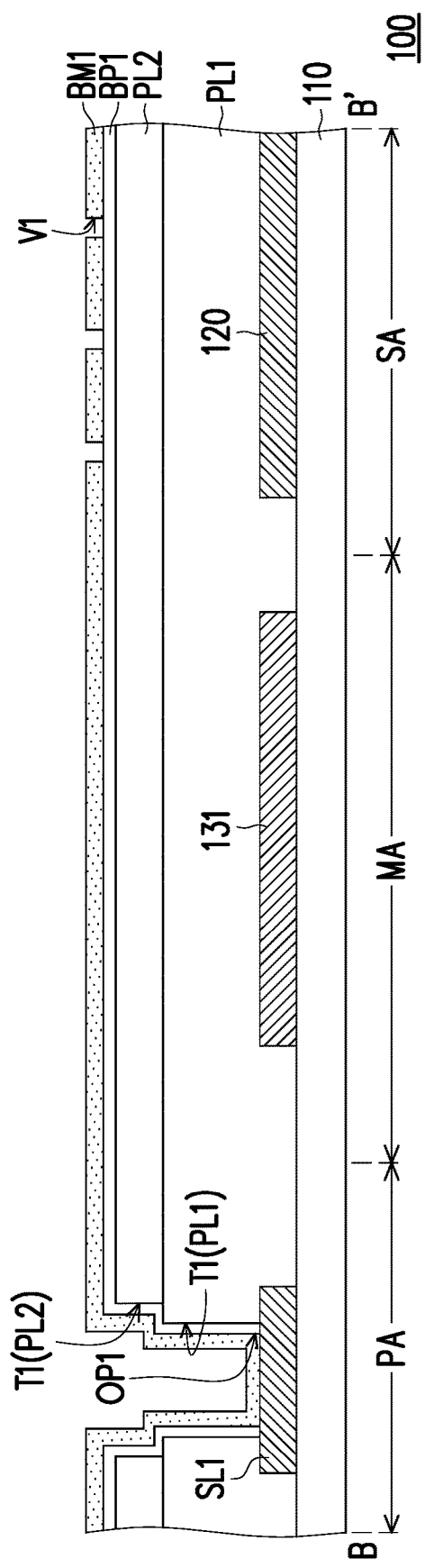
FIG. 1E is a schematic cross-sectional view taken along a sectional line B-B' in FIG. 1A.
Figure 1F:
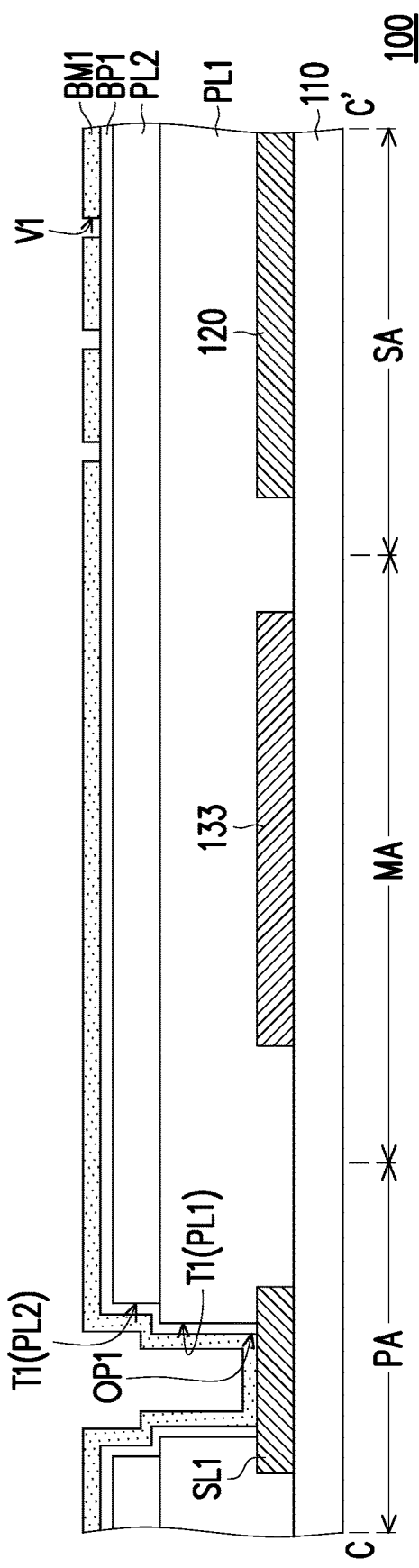
FIG. 1F is a schematic cross-sectional view taken along a sectional line C-C' in FIG. 1A.

FIG. 1A is a schematic top view of a fingerprint sensing device 100 according to an embodiment of the disclosure. FIG. 1B is a schematic enlarged view of an area I in the sensing area SA of the fingerprint sensing device 100 depicted in FIG. 1A. FIG. 1C is a schematic cross-sectional view taken along a sectional line A-A' in FIG. 1B. FIG. 1D is a schematic enlarged view of an area II in the peripheral area PA of the fingerprint sensor device 100 depicted in FIG. 1A. FIG. 1E is a schematic cross-sectional view taken along a sectional line B-B' in FIG. 1A. FIG. 1F is a schematic cross-sectional view taken along a sectional line C-C' in FIG. 1A. For clear and concise illustration, a first planarization layer PL1, a second planarization layer PL2, and a first shading layer BM1 are omitted in FIG. 1A.

Hereinafter, please refer to FIG. 1A to FIG. 1F to clearly understand the overall structure of the fingerprint sensing device 100. The fingerprint sensing device 100 has a sensing area SA, an operation area MA, and a peripheral area PA, wherein the operation area MA is located between the sensing area SA and the peripheral area PA. The fingerprint sensing device 100 includes a substrate 110, a sensing element 120, an operation element 130, a first signal line SL1, the first planarization layer PL1, a first insulating layer BP1, and the first shading layer BM1. The sensing element 120 is located on the substrate 110 and located at the sensing area SA. The operation element 130 is located on the substrate 110 and located at the operation area MA. The first signal line SL1 is located on the substrate 110 and located at the peripheral area PA. The first planarization layer PL1 is located on the substrate 110 and has a first trench T1, wherein the first trench T1 overlaps the first signal line SL1. The first insulating layer BP1 is located on the first planarization layer PL1 and in the first trench T1, and the first insulating layer BP1 has a first opening OP1, wherein the first opening OP1 is located in the first trench T1. The first shading layer BM1 is located on the first insulating layer BP1 and connected to the first signal line SL1 through the first opening OP1.

In view with the above, in the fingerprint sensing device 100 provided in an embodiment of the disclosure, the first trench T1 serves to isolate the first planarization layer PL1, and the first insulating layer BP1 disposed above and on a side of the first planarization layer PL1 serves to block moisture, so as to prevent the first planarization layer PL1 from absorbing the moisture. Thereby, the impact of moisture on the operation element 130 may be lessened. In addition, the first shading layer BM1 connected to the first signal line SL1 may discharge static electricity and thus may achieve an anti-ESD effect on the fingerprint sensor device 100.

With reference to FIG. 1A to FIG. 1F, the way to implement each element and each film layer of the fingerprint sensor device 100 is to be explained, which should however not be construed as a limitation in the disclosure.

As shown in 1A, the substrate 110 may be a transparent substrate or a non-transparent substrate, and a material of the substrate 110 may be a quartz substrate, a glass substrate, a polymer substrate, or any other suitable materials, which should however not be construed as a limitation in the disclosure. Various film layers, such as a signal line, a driving element, a testing element, a switch element, a storage capacitor, and so on, may be formed on the substrate 110.

The operation area MA of the fingerprint sensing device 100 may be located at the peripheries of the sensing area SA. For instance, in this embodiment, the operation area MA may surround the sensing area SA, which should however not be construed as a limitation in the disclosure. In some embodiments, the operation area MA may be disposed at one side of the sensing area SA. The operation area MA mainly contains the operation element 130, and the operation element 130 may include driving elements 131 and 132 and a testing element 133, which should however not be construed as a limitation in the disclosure. For instance, in this embodiment, the driving elements 131 and 132 may respectively include a gate on array circuit, and the testing element 133 may include a testing circuit of the sensing element 120 for testing; for instance, the testing element 133 may include a testing circuit composed of a plurality of thin film transistors.

The peripheral area PA of the fingerprint sensing device 100 may be located at the peripheries of the operation area MA. For instance, in this embodiment, the operation area MA surrounds the sensing area SA, and the peripheral area PA surrounds the operation area MA, which should however not be construed as a limitation in the disclosure. In some embodiments, the operation area MA is only disposed at one side of the sensing area SA, and the peripheral area PA may surround and may be located at the peripheries of the sensing area SA and the operation area MA. The peripheral area PA may include a chip bonding area IC, and the chip bonding area IC may be applied for accommodating a chip, for instance.

With reference to FIG. 1B and FIG. 1C, the sensing area SA of the fingerprint sensing device 100 is the primary sensing area of the fingerprint sensing device 100, and there may be a plurality of sensing elements 120 in the sensing area SA. For instance, in this embodiment, the sensing element 120 may include a first electrode 121, a sensing layer 122, and a second electrode 123.

In some embodiments, the first electrode 121 may be located on the substrate 110. In some embodiments, a switch element electrically connected to the first electrode 121 and other insulating layers may be disposed between the first electrode 121 and the substrate 110, for instance. A material of the first electrode 121 is, for instance, molybdenum, aluminum, titanium, copper, gold, silver, other conductive materials, or two or more of the foregoing materials stacked together. In some embodiments, the sensing layer 122 is disposed on the first electrode 121. A material of the sensing layer 122 is, for instance, silicon-rich oxide (SRO) or other suitable materials. In some embodiments, the second electrode 123 is located on the sensing layer 122, such that the sensing layer 122 is sandwiched between the first electrode 121 and the second electrode 123. A material of the second electrode 123 is preferably a transparent conductive material, such as indium tin oxide, indium zinc oxide, aluminum tin oxide, aluminum zinc oxide, indium gallium zinc oxide, other suitable oxides, or a stacked layer containing at least two of the materials above.

In this embodiment, the first planarization layer PL1 is located between the first electrode 121 and the second electrode 123, the fingerprint sensing device 100 may further include the second planarization layer PL2, and the second planarization layer PL2 may cover the second electrode 123, which should however not be construed as limitations in the disclosure. In some embodiments, the first planarization layer PL1 has a plurality of holes TH, and the second electrode 123 is conformally formed on the first planarization layer PL1, so that a plurality of concave portions ST may be correspondingly formed at the second electrode 123. For instance, a material of the first planarization layer PL1 and the second planarization layer PL2 may include an organic material, such as an acrylic material, a siloxane material, a polyimide material, an epoxy resin material, or a stacked layer containing the above materials, which should however not be construed as a limitation in the disclosure.

In this embodiment, the first insulating layer BP1 is located between the second planarization layer PL2 and the first shading layer BM1. In the sensing area SA, the first shading layer BM1 may have a plurality of through holes V1, and the through holes V1 overlap the concave portions ST of the second electrode 123 of the sensing element 120, respectively. As such, the sensing element 120 may receive the light passing through the through holes V1 for performing a sensing function.

With reference to FIG. 1A and FIG. 1D to FIG. 1F, in this embodiment, the first planarization layer PL1, the second planarization layer PL2, the first insulating layer BP1, and the first shading layer BM1 may extend from the sensing area SA to the peripheral area PA through the operation area MA. The first planarization layer PL1 and the second planarization layer PL2 may have the first trench T1, and the first trench T1 is located in the peripheral area PA. In some embodiments, an orthogonal projection of the first trench T1 on the substrate 110 falls within an orthogonal projection of the first signal line SL1 on the substrate 110.

The first insulating layer BP1 may extend into the first trench T1 and cover sidewalls of the first planarization layer PL1 and the second planarization layer PL2. The first opening OP1 of the first insulating layer BP1 may overlap the first signal line SL1 and expose the first signal line SL1, so that the first shading layer BM1 may be connected to the first signal line SL1 through the first opening OP1. In this embodiment, a material of the first insulating layer BP1 may include an inorganic material, such as silicon oxide, silicon nitride, silicon oxynitride, or a stacked layer containing the above materials, which should however not be construed as a limitation in the disclosure.

In this embodiment, the first shading layer BM1 may include, for instance, a metal layer and a transparent oxide layer, wherein the metal layer may be located between the first insulating layer BP1 and the transparent oxide layer, which should however not be construed as a limitation in the disclosure. A material of the metal layer may include metal with good conductivity, such as aluminum, molybdenum, titanium, and so forth. In some embodiments, the metal layer may have a single-layer structure or a multi-layer structure, and the multi-layer structure may be a combination of the aluminum layer, the molybdenum layer, and the titanium layer, such as a stacked layer containing any two or more layers of aluminum, molybdenum, and titanium. The variations and combinations may differ according to actual needs. For instance, the metal layer may include the titanium layer, the aluminum layer, and the titanium layer that are sequentially stacked or the molybdenum layer, the aluminum layer, and the molybdenum layer that are sequentially stacked, which should however not be construed as a limitation in the disclosure. A material of the transparent oxide layer may include transparent oxide with low reflectivity, such as MoTaOx, which should however not be construed as a limitation in the disclosure.

In this embodiment, the first signal line SL1 may be a grounded line, which should however not be construed as a limitation in the disclosure. In some embodiments, the first signal line SL1 may also be a direct current power line with a strong voltage, which may be determined according to actual design requirements. A material of the first signal line SL1 may be metal or alloy with good conductivity, such as gold, silver, copper, aluminum, titanium, molybdenum, or a combination thereof, which should however not be construed as a limitation in the disclosure.

Figure 2A:
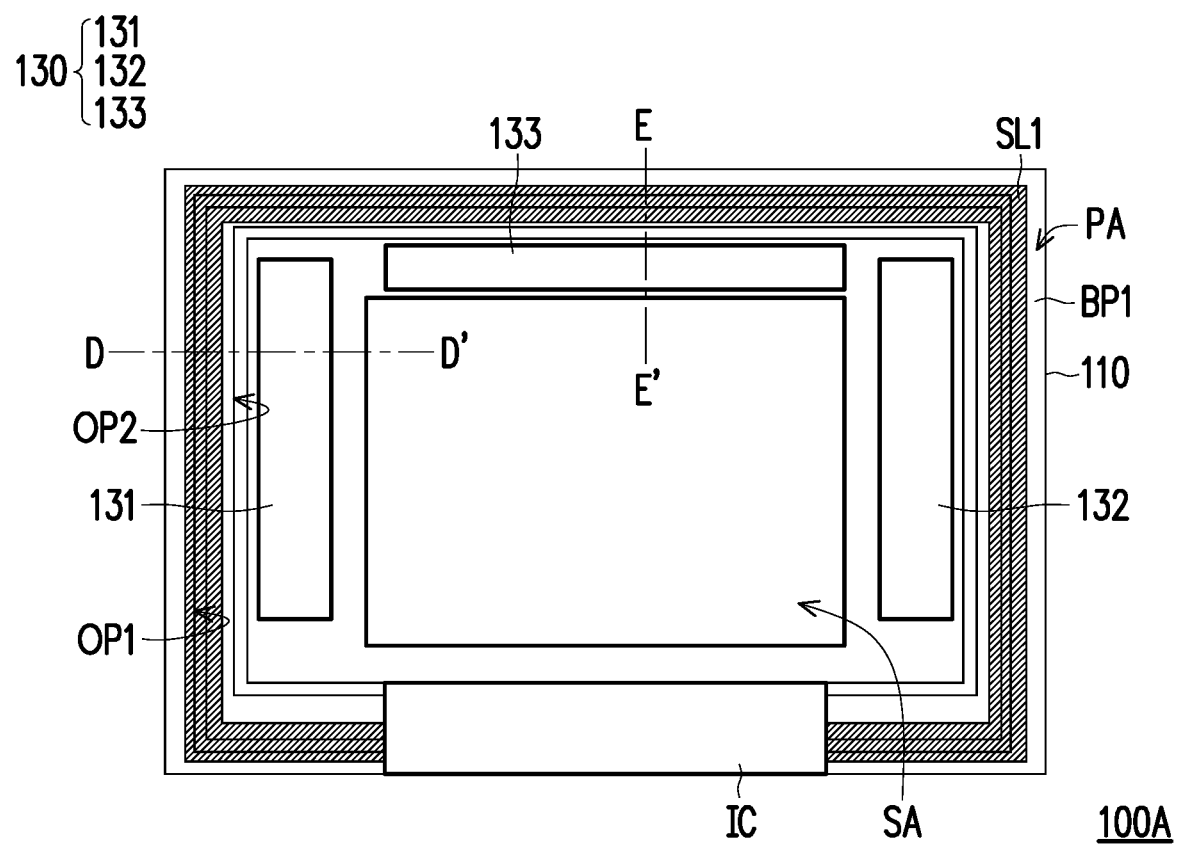
FIG. 2A is a schematic top view of a fingerprint sensing device 100A according to an embodiment of the disclosure.
Figure 2B:
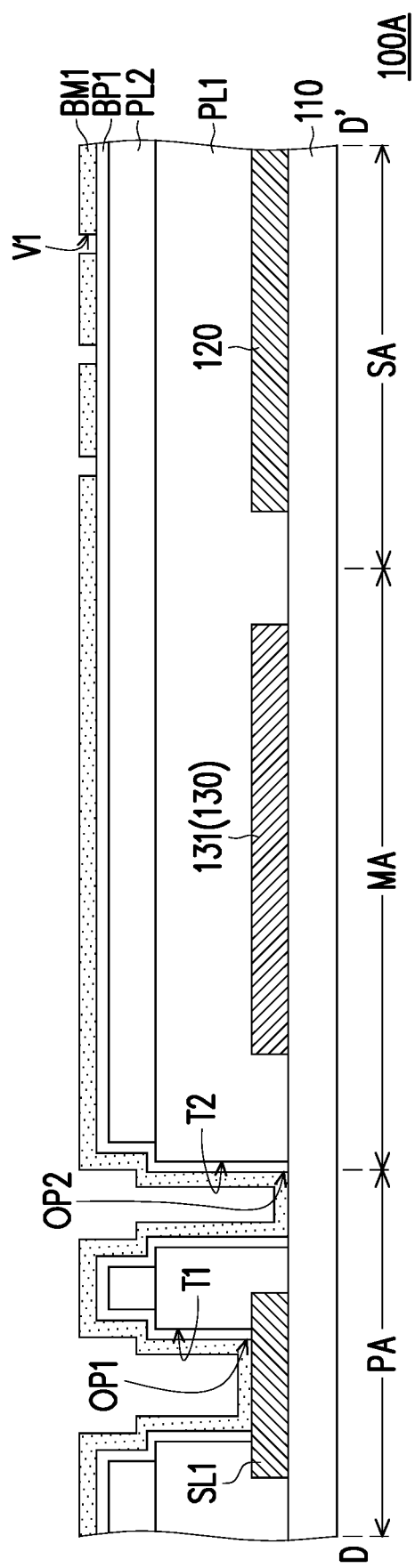
FIG. 2B is a schematic cross-sectional view taken along a sectional line D-D' in FIG. 2A.
Figure 2C:
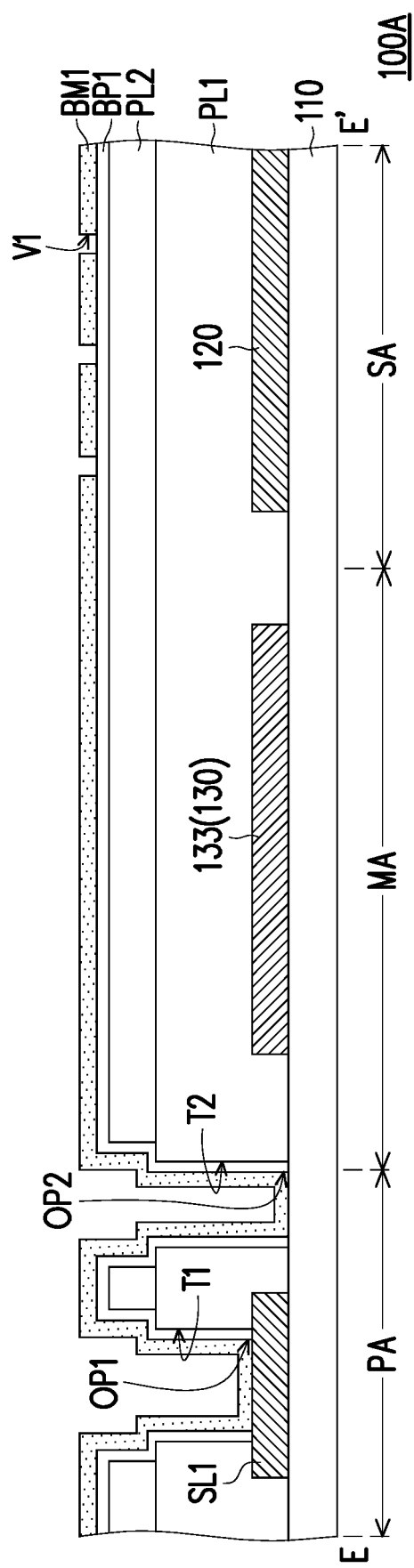
FIG. 2C is a schematic cross-sectional view taken along a sectional line E-E' in FIG. 2A.

Another embodiment of the disclosure is provided hereinafter. FIG. 2A is a schematic top view of a fingerprint sensing device 100A according to an embodiment of the disclosure. FIG. 2B is a schematic cross-sectional view taken along a sectional line D-D' in FIG. 2A. FIG. 2C is a schematic cross-sectional view taken along a sectional line E-E' in FIG. 2A. For clear and concise illustration, the first planarization layer PL1, the second planarization layer PL2, and the first shading layer BM1 are omitted in FIG. 2A. With reference to FIG. 2A to FIG. 2C, the way to implement each element and each film layer of the fingerprint sensing device 100A is further explained, and the reference numbers and related content provided in the embodiments shown in FIG. 1A to FIG. 1F are also applied hereinafter, which should however not be construed as a limitation in the disclosure.

The difference between the structure of the fingerprint sensing device 100 shown in FIG. 1A to FIG. 1F and the structure of the fingerprint sensing device 100A shown in FIG. 2A to FIG. 2C lies in that the first planarization layer PL1 and the second planarization layer PL2 further have a second trench T2, and the second trench T2 is located between the first trench T1 and the operation element 130. In addition, the first insulating layer BP1 has a first opening OP1 and a second opening OP2, the second opening OP2 is located in the second trench T2, and the first shading layer BM1 is located in the first opening OP1 and the second opening OP2.

In this embodiment, the first shading layer BM1 is connected to the first signal line SL1 through the first opening OP1 to achieve an anti-ESD effect on the fingerprint sensing device 100A. In addition, the second opening OP2 may expose the film layer under the first planarization layer PL1, and the first shading layer BM1 may contact the film layer below the first planarization layer PL1, so that the first insulating layer BP1 and the first shading layer BM1 in the second trench T2 may prevent moisture from entering the first planarization layer PL1 and the second planarization layer PL2. Since the first insulating layer BP1 and the first shading layer BM1 in the second trench T2 may, at a close distance, cover the first planarization layer PL1 and the second planarization layer PL2 next to the operation element 130 (including the driving elements 131 and 132 and the testing element 133), it is possible to prevent the moisture from entering the first planarization layer PL1 and the second planarization layer PL2 around the operation element 130 at a close distance.

Figure 3A:
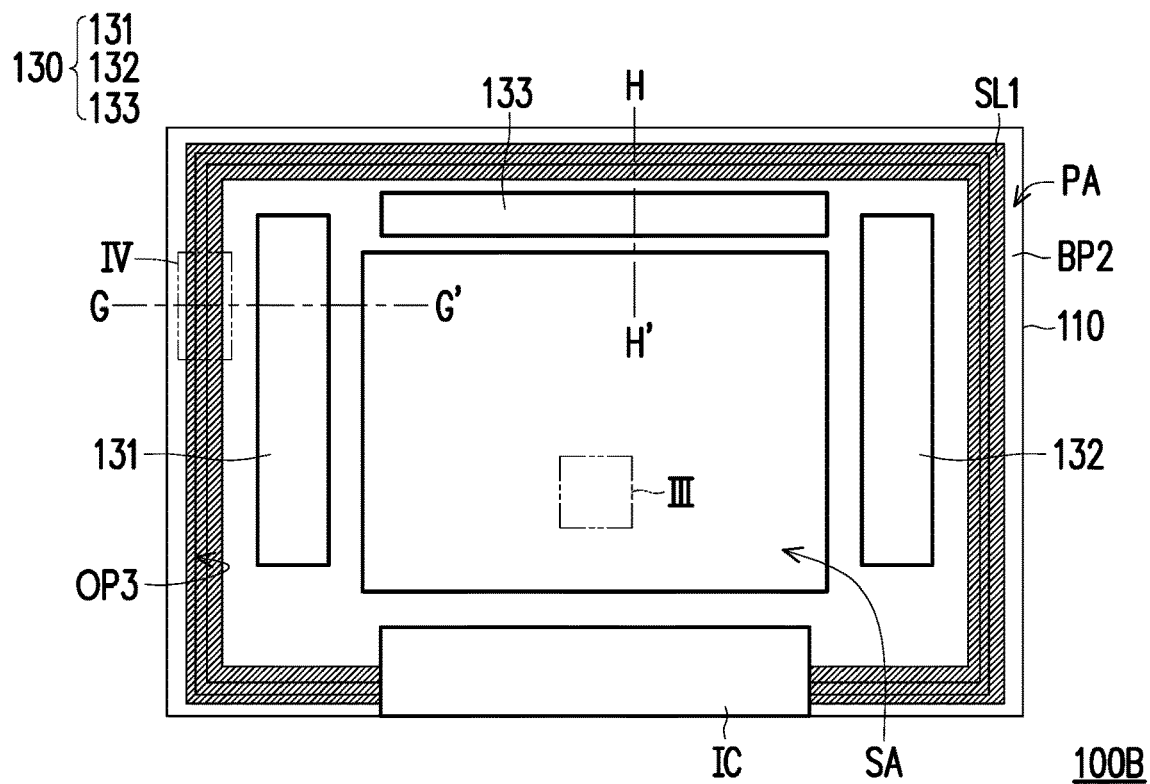
FIG. 3A is a schematic top view of a fingerprint sensing device 100B according to an embodiment of the disclosure.
Figure 3B:
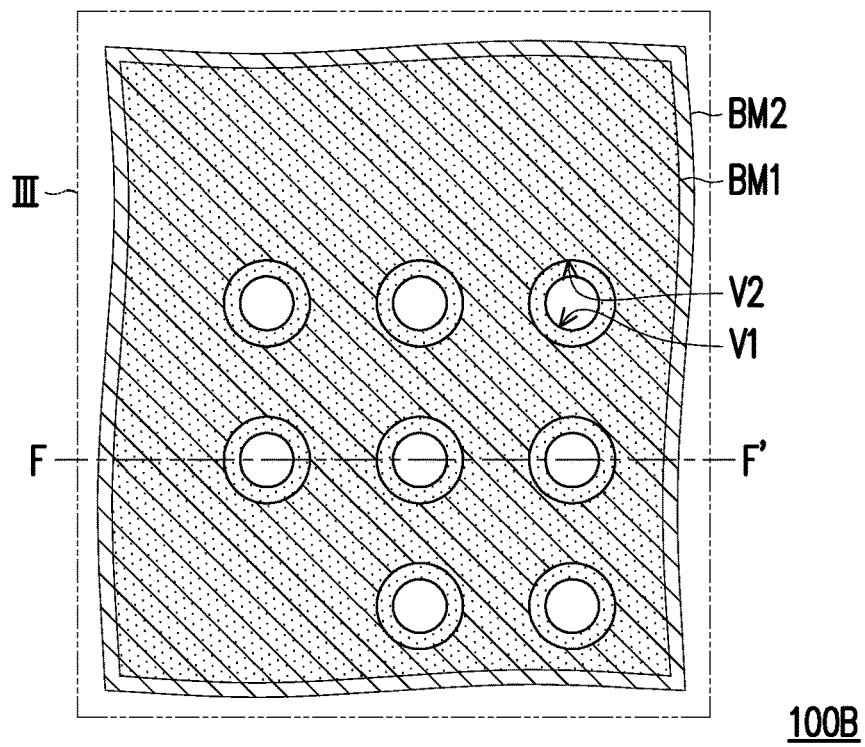
FIG. 3B is a schematic enlarged view of an area III in the sensing area SA of the fingerprint sensing device 100B depicted in FIG. 3A.
Figure 3C:
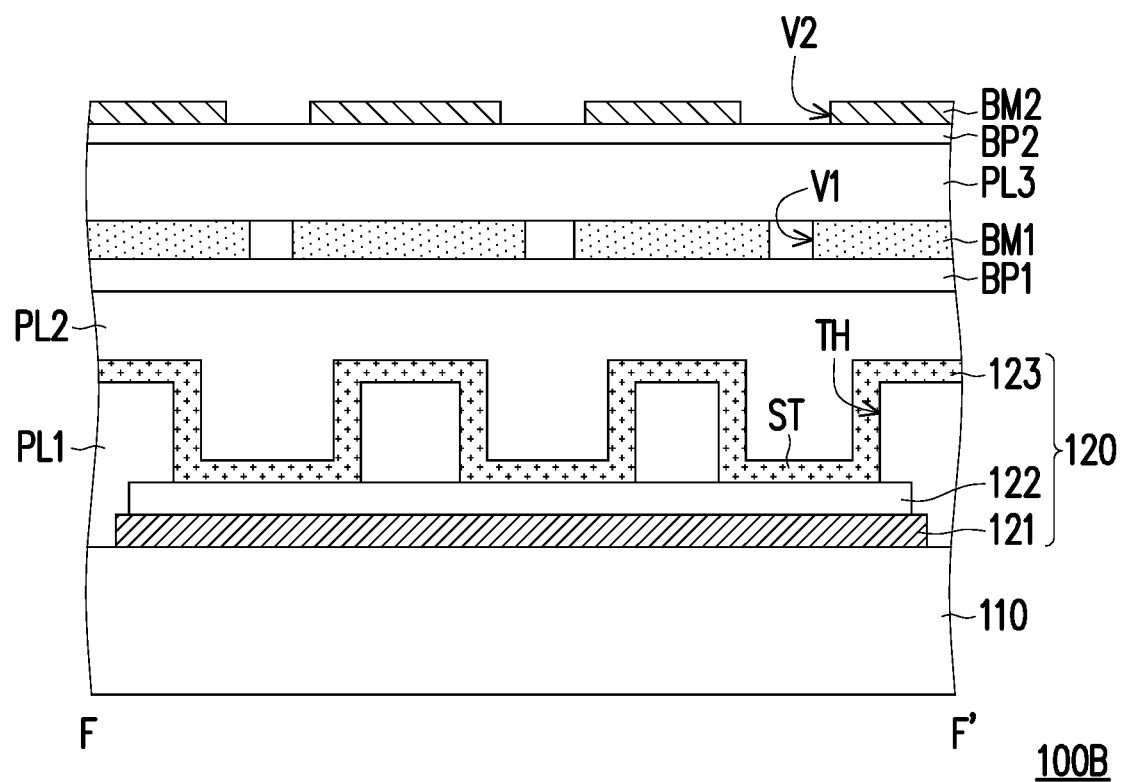
FIG. 3C is a schematic cross-sectional view taken along a sectional line F-F' in FIG. 3B.
Figure 3D:
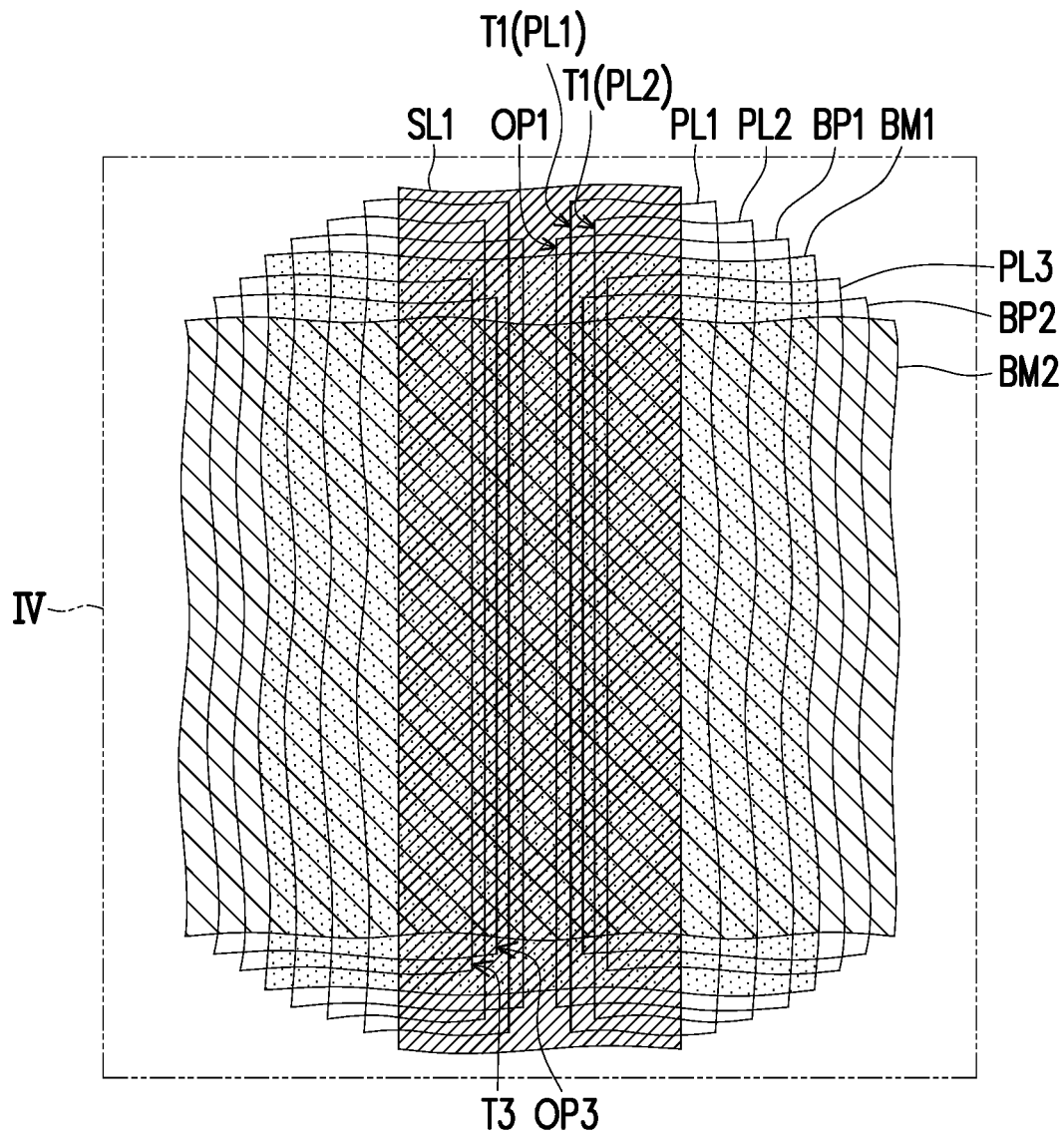
FIG. 3D is a schematic enlarged view of an area IV in the peripheral area PA of the fingerprint sensor device 100B depicted in FIG. 3A.

FIG. 3A is a schematic top view of a fingerprint sensing device 100B according to an embodiment of the disclosure. FIG. 3B is a schematic enlarged view of an area III in the sensing area SA of the fingerprint sensing device 100B depicted in FIG. 3A. FIG. 3C is a schematic cross-sectional view taken along a sectional line F-F' in FIG. 3B. FIG. 3D is a schematic enlarged view of an area IV in the peripheral area PA of the fingerprint sensor device 100B depicted in FIG. 3A. FIG. 3E is a schematic cross-sectional view taken along a sectional line G-G' in FIG. 3A. FIG. 3F is a schematic cross-sectional view taken along a sectional line H-H' in FIG. 3A. For clear and concise illustration, the first planarization layer PL1, the second planarization layer PL2, the first insulating layer BP1, the first shading layer BM1, a third planarization layer PL3, and the second shading layer BM2 are omitted in FIG. 3A. With reference to FIG. 3A to FIG. 3F, the way to implement each element and each film layer of the fingerprint sensing device 100B is further explained, and the reference numbers and related content provided in the embodiments shown in FIG. 1A to FIG. 1F are also applied hereinafter, which should however not be construed as a limitation in the disclosure.

The difference between the structure of the fingerprint sensing device 100 shown in FIG. 1A to FIG. 1F and the structure of the fingerprint sensing device 100B shown in FIG. 3A to FIG. 3F lies in that the fingerprint sensing device 100B further includes a third planarization layer PL3, a second insulating layer BP2, and a second shading layer BM2 sequentially on the first shading layer BM1, wherein the third planarization layer PL3 has a third trench T3, and the third trench T3 overlaps the first trench T1. The second insulating layer BP2 has a third opening OP3, and the third opening OP3 is located in the third trench T3. The second shading layer BM2 is connected to the first shading layer BM1 through the third opening OP3.

With reference to FIG. 3A to FIG. 3C, in this embodiment, the second shading layer BM2 may have a plurality of through holes V2 in the sensing area SA, and the through holes V2 respectively overlap the through holes V1 in the first shading layer BM1. Thereby, the through holes V1 and the through holes V2 may adjust a light receiving angle of the sensing element 120, so that the sensing element 120 may have a good fingerprint image quality, and the fingerprint sensing device 100B may achieve good fingerprint recognition.

In this embodiment, a material of the second shading layer BM2 may include shading materials, such as metal, black resin, graphite, or a stacked layer containing the above-mentioned shading materials. For instance, in some embodiments, the second shading layer BM2 may include a stacked layer of a metal layer and a transparent oxide layer, wherein a material of the metal layer may include metal with good conductivity, such as aluminum, molybdenum, titanium, or a stacked layer containing said metal, and a material of the transparent oxide layer may include transparent oxide with low reflectivity, such as MoTaOx. In some embodiments, the second shading layer BM2 may include a non-conductive material, such as black resin, graphite, or the like.

With reference to FIG. 3A and FIG. 3D to FIG. 3F, in this embodiment, the third planarization layer PL3 is located between the first shading layer BM1 and the second insulating layer BP2, and the second insulating layer BP2 is located between the third planarization layer PL3 and the second shading layer BM2. The third planarization layer PL3, the second insulating layer BP2, and the second shading layer BM2 may extend from the sensing area SA to the peripheral area PA through the operation area MA. A material of the third planarization layer PL3 may include an organic material, such as an acrylic material, a siloxane material, a polyimide material, an epoxy resin material, or a stacked layer containing the above materials, which should however not be construed as a limitation in the disclosure. A material of the second insulating layer BP2 may include an inorganic material, such as silicon oxide, silicon nitride, silicon oxynitride, or a stacked layer containing the above materials, which should however not be construed as a limitation in the disclosure.

In this embodiment, the second insulating layer BP2 may extend into the third trench T3 and completely cover a sidewall of the third planarization layer PL3 to prevent moisture from entering the third planarization layer PL3. The third opening OP3 at least exposes a portion of the first shading layer BM1 in the first trench T1, so that the second shading layer BM2 is in contact with the first shading layer BM1 through the third opening OP3.

Figure 4A:
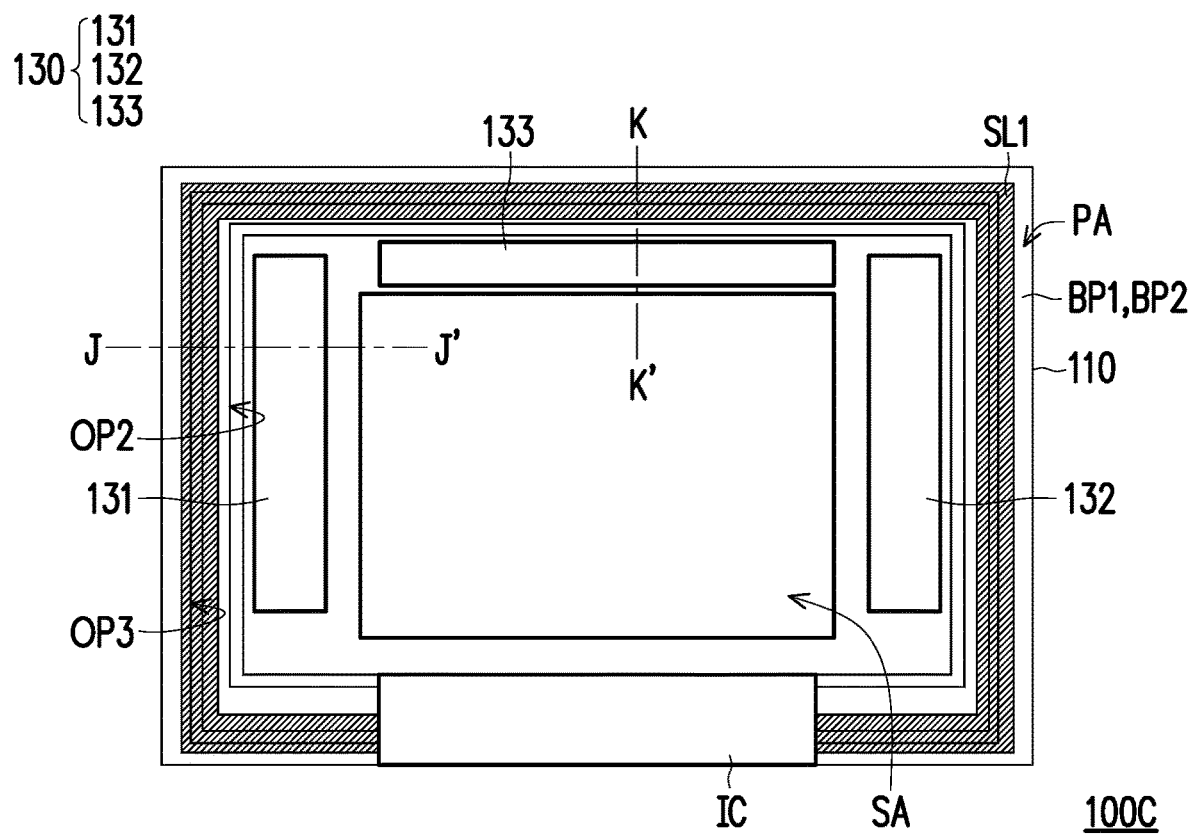
FIG. 4A is a schematic top view of a fingerprint sensing device 100C according to an embodiment of the disclosure.
Figure 4B:
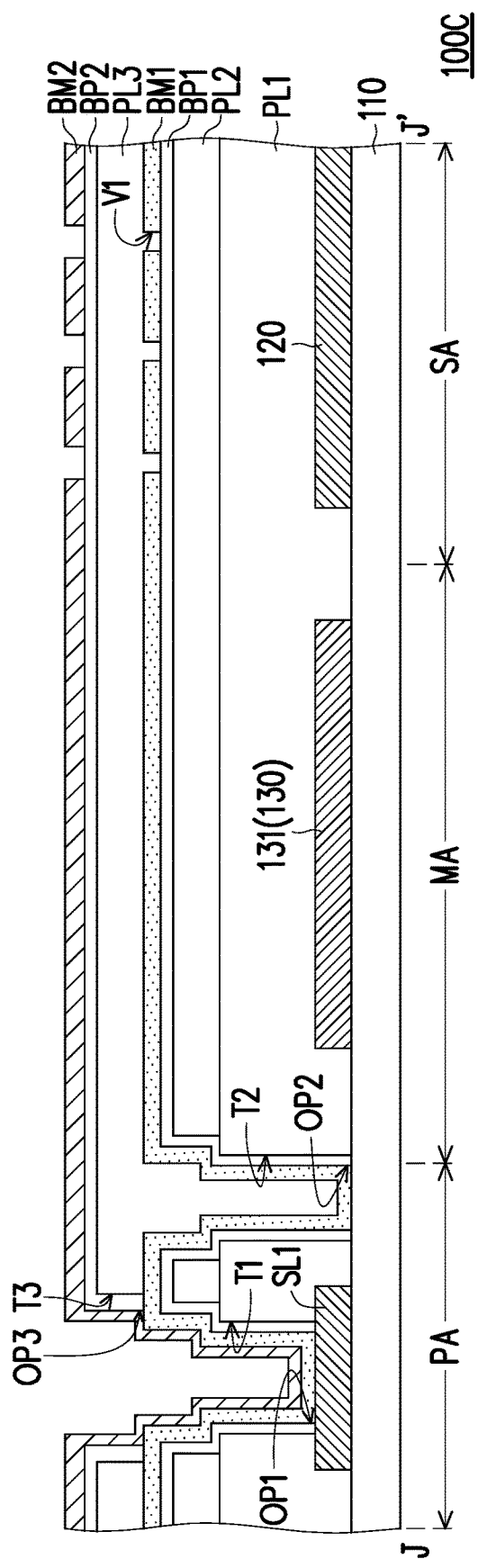
FIG. 4B is a schematic cross-sectional view taken along a sectional line J-J' in FIG. 4A.
Figure 4C:
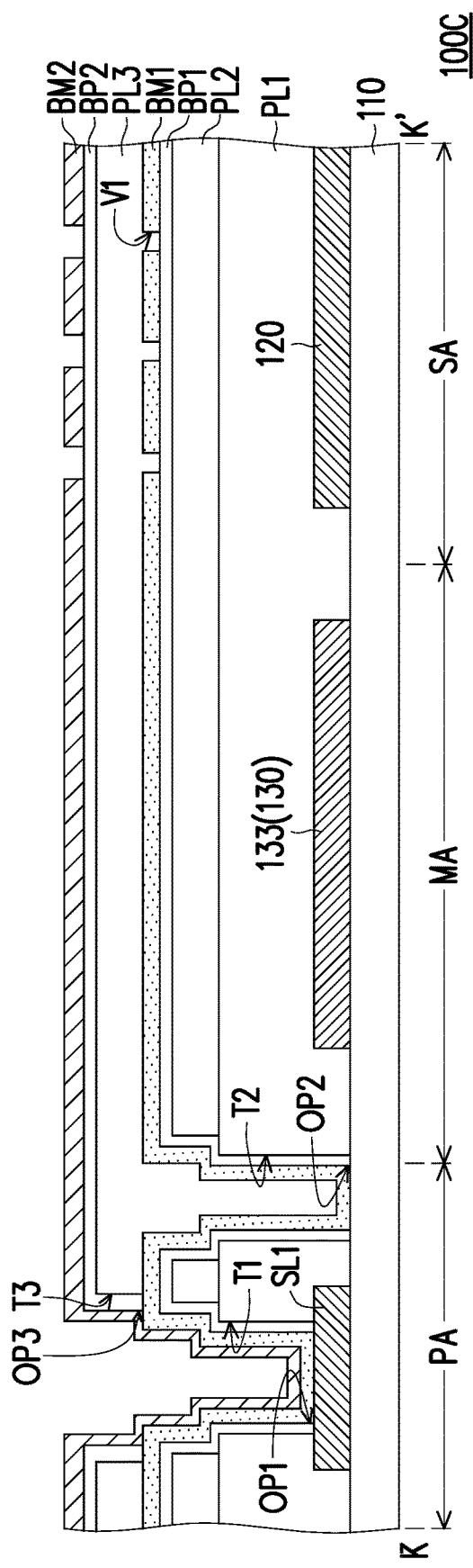
FIG. 4C is a schematic cross-sectional view taken along a sectional line K-K' in FIG. 4A.

FIG. 4A is a schematic top view of a fingerprint sensing device 100C according to an embodiment of the disclosure. FIG. 4B is a schematic cross-sectional view taken along a sectional line J-J' in FIG. 4A. FIG. 4C is a schematic cross-sectional view taken along a sectional line K-K' in FIG. 4A. For clear and concise illustration, the first planarization layer PL1, the second planarization layer PL2, the first shading layer BM1, the third planarization layer PL3, and the second shading layer BM2 are omitted in FIG. 4A. With reference to FIG. 4A to FIG. 4C, the way to implement each element and each film layer of the fingerprint sensing device 100C is further explained, and the reference numbers and related content provided in the embodiments shown in FIG. 1A to FIG. 1F are also applied hereinafter, which should however not be construed as a limitation in the disclosure.

The difference between the structure of the fingerprint sensing device 100B shown in FIG. 3A to FIG. 3F and the structure of the fingerprint sensing device 100C shown in FIG. 4A to FIG. 4C lies in that the first planarization layer PL1 and the second planarization layer PL2 further have a second trench T2, and the second trench T2 is located between the first trench T1 and the operation element 130. In addition, the first insulating layer BP1 further has the second opening OP2 located in the second trench T2, and the first shading layer BM1 is located in the second opening OP2.

In this embodiment, the second trench T2 may separate the first planarization layer PL1 and the second planarization layer PL2, and the first insulating layer BP1 and the first shading layer BM1 in the second trench T2 may prevent moisture from entering the first planarization layer PL1 and the second planarization layer PL2. Since the first insulating layer BP1 and the first shading layer BM1 in the second trench T2 may, at a close distance, cover the first planarization layer PL1 and the second planarization layer PL2 next to the operation element 130 (including the driving elements 131 and 132 and the testing element 133), the impact of the moisture on the operation element 130 may be lessened at a close distance.

Figure 5A:
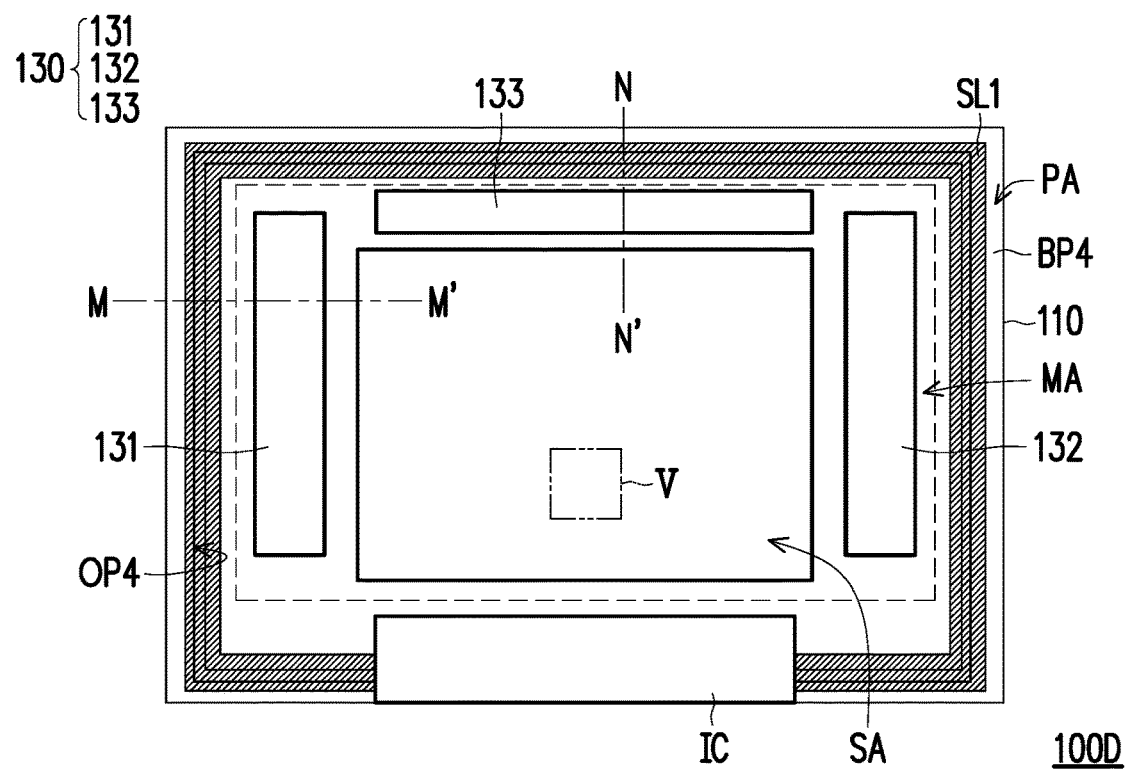
FIG. 5A is a schematic top view of a fingerprint sensing device 100D according to an embodiment of the disclosure.
Figure 5B:
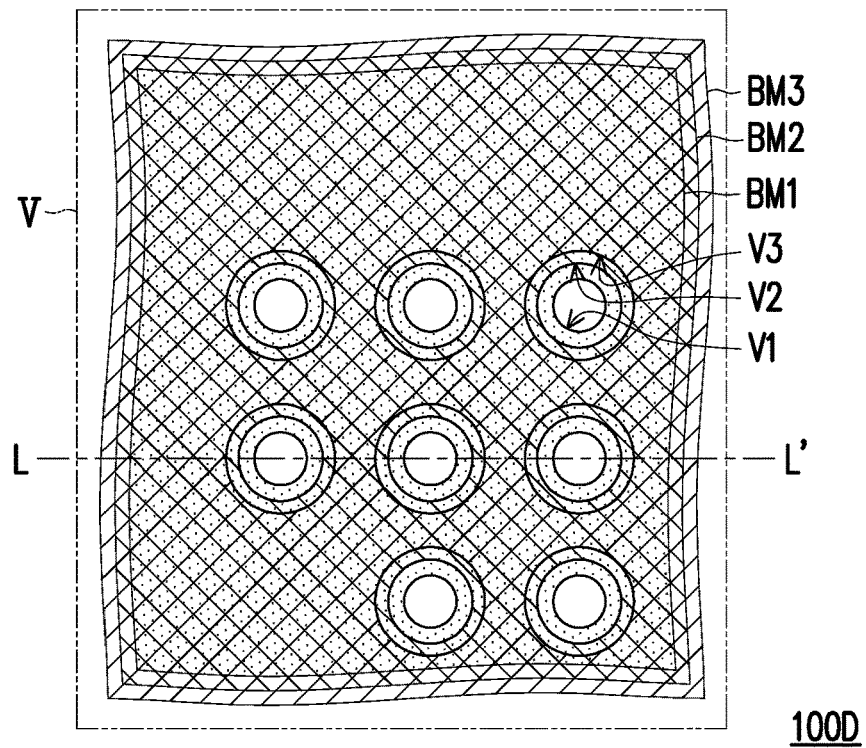
FIG. 5B is a schematic enlarged view of an area V in the sensing area SA of the fingerprint sensing device 100D depicted in FIG. 5A.
Figure 5C:
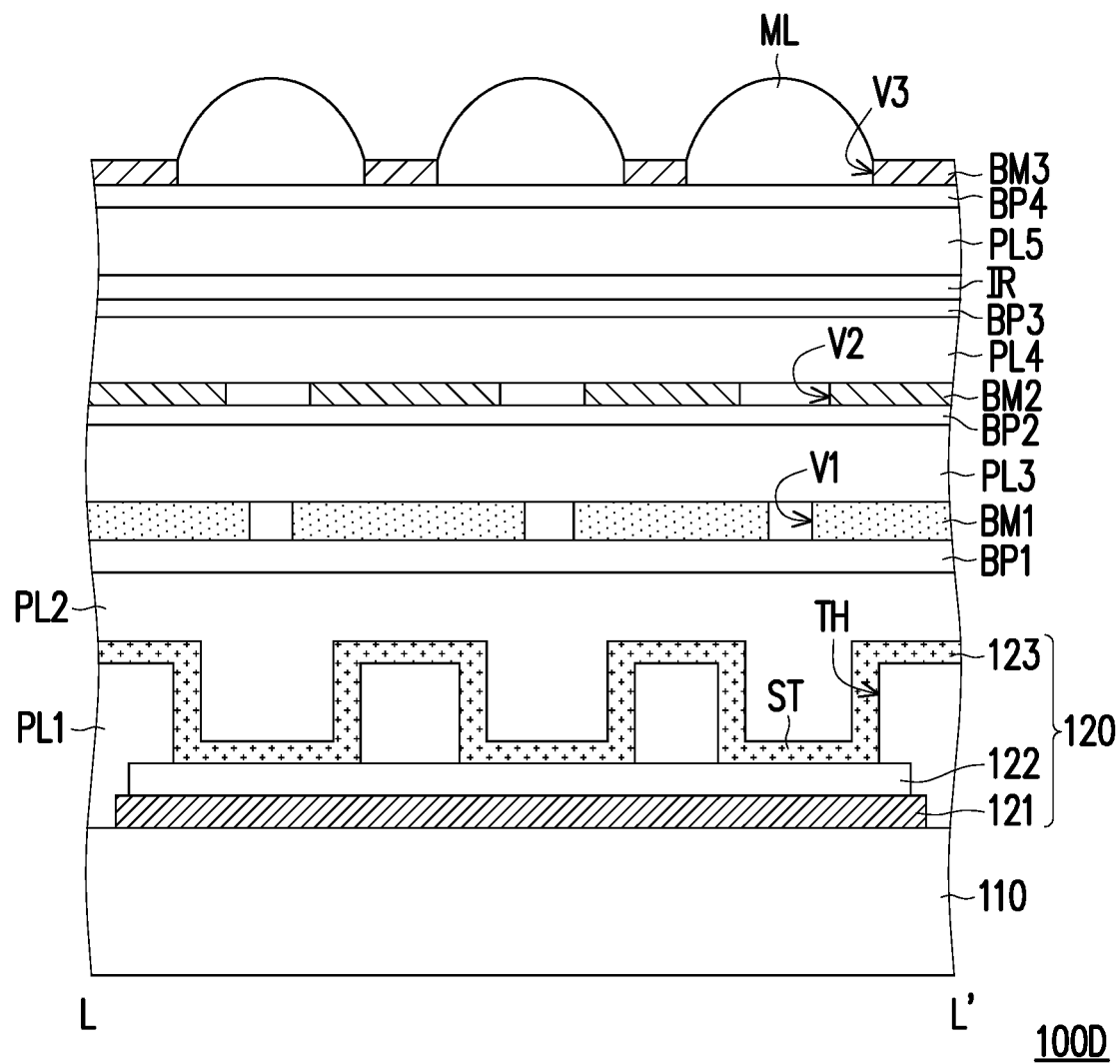
FIG. 5C is a schematic cross-sectional view taken along a sectional line L-L' in FIG. 5B.
Figure 5D:
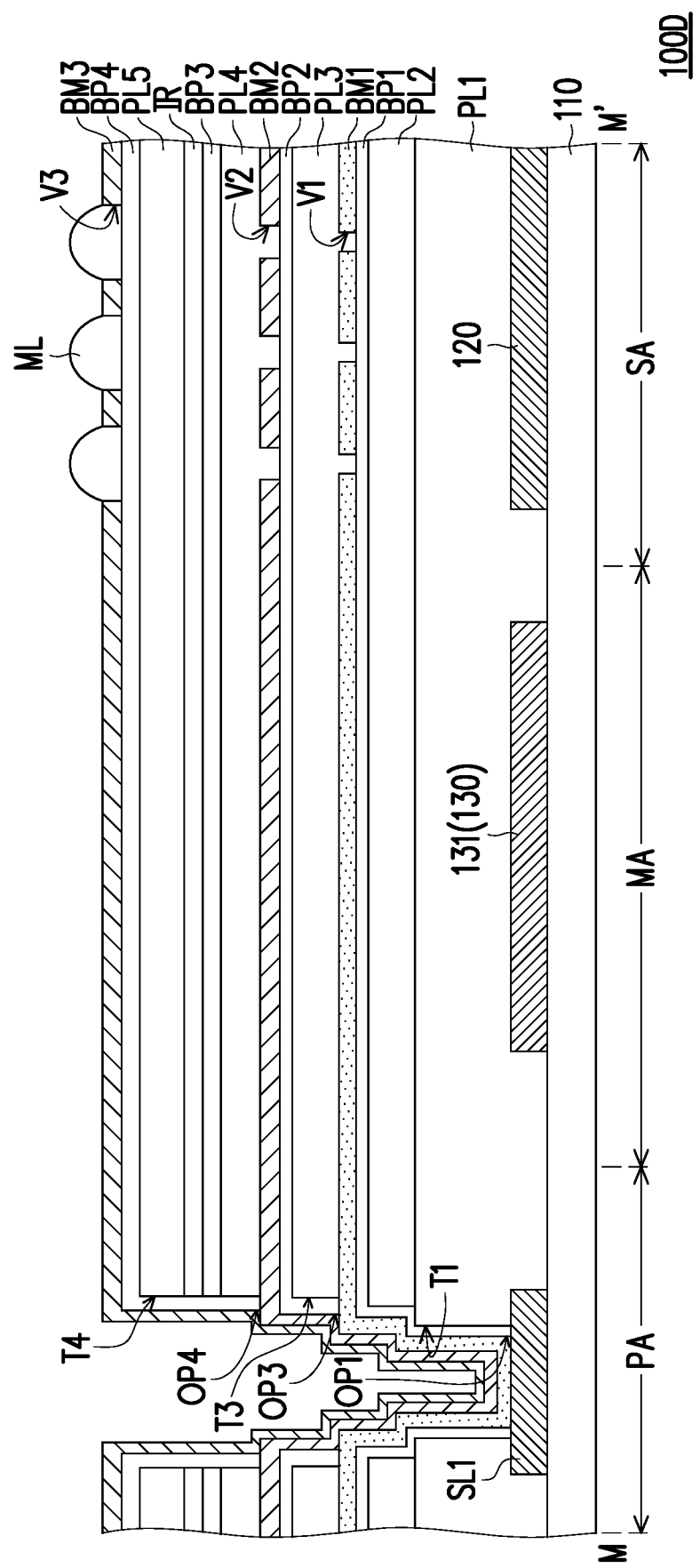
FIG. 5D is a schematic cross-sectional view taken along a sectional line M-M' in FIG. 5A.
Figure 5E:
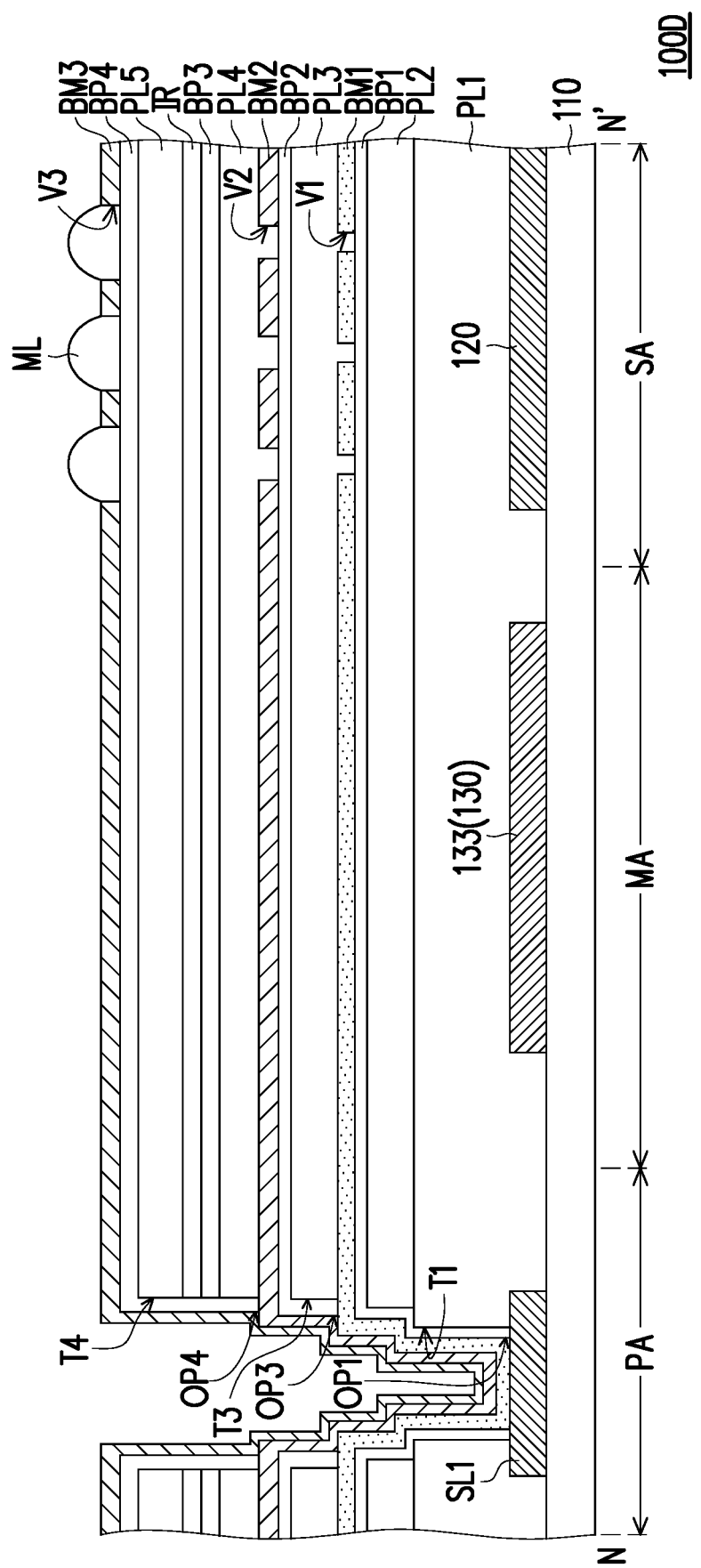
FIG. 5E is a schematic cross-sectional view taken along a sectional line N-N' in FIG. 5A.

FIG. 5A is a schematic top view of a fingerprint sensing device 100D according to an embodiment of the disclosure. FIG. 5B is a schematic enlarged view of an area V in the sensing area SA of the fingerprint sensing device 100D depicted in FIG. 5A. FIG. 5C is a schematic cross-sectional view taken along a sectional line L-L' in FIG. 5B. FIG. 5D is a schematic cross-sectional view taken along a sectional line M-M' in FIG. 5A. FIG. 5E is a schematic cross-sectional view taken along a sectional line N-N' in FIG. 5A. For clear and concise illustration, the first planarization layer PL1, the second planarization layer PL2, the first insulating layer BP1, the first shading layer BM1, the third planarization layer PL3, the second insulating layer BP2, the second shading layer BM2, a fourth planarization layer PL4, a third insulating layer BP3, a fifth planarization layer PL5, a third shading layer BM3, and a microlens structure ML are omitted in FIG. 5A. With reference to FIG. 5A to FIG. 5E, the way to implement each element and each film layer of the fingerprint sensing device 100D is further explained, and the reference numbers and related content provided in the embodiments shown in FIG. 1A to FIG. 1F are also applied hereinafter, which should however not be construed as a limitation in the disclosure.

The difference between the structure of the fingerprint sensing device 100B shown in FIG. 3A to FIG. 3F and the structure of the fingerprint sensing device 100D shown in FIG. 5A to FIG. 5E lies in that the fingerprint sensing device 100D further includes the fourth planarization layer PL4, the third insulating layer BP3, the fifth planarization layer PL5, the fourth insulating layer BP4, the third shading layer BM3, and the microlens structure ML sequentially on the second shading layer BM2, wherein the fourth planarization layer PL4, the third insulating layer BP3, and the fifth planarization layer PL5 have a fourth trench T4, and the fourth trench T4 overlaps the third trench T3. The fourth insulating layer BP4 has a fourth opening OP4, and the fourth opening OP4 is located in the fourth trench T4. The third shading layer BM3 is connected to the second shading layer BM2 through the fourth opening OP4.

With reference to FIG. 5A to FIG. 5C, in this embodiment, the third shading layer BM3 may have a plurality of through holes V3 in the sensing area SA, the through holes V3 respectively overlap the through holes V2 in the second shading layer BM2, and the microlens structure ML may be disposed in the through holes V3. The microlens structure ML may be a lens structure whose center thickness is greater than the edge thickness, such as a symmetrical double-convex lens, asymmetrical double-convex lens, a plano-convex lens, or a concave-convex lens. The microlens structure ML may enhance light collimation, so that issues of light leakage and light mixture caused by scattered light or refracted light may be better resolved, and the image resolution may be further improved. As such, external light may first pass through the microlens structure ML, the through holes V2, and the through holes V1 to enhance collimation, and the external light then enters the sensing element 120, so that the sensing element 120 may obtain a fingerprint image with good quality, whereby the fingerprint sensing device 100D may achieve good fingerprint recognition.

In this embodiment, a material of the third shading layer BM3 may include a shading material, such as metal, black resin, graphite, or a stacked layer containing the above-mentioned shading materials. For instance, in some embodiments, the third shading layer BM3 may include a stacked layer of a metal layer and a transparent oxide layer, a material of the metal layer may include metal with good conductivity, such as aluminum, molybdenum, titanium, or a stacked layer containing said metal, and a material of the transparent oxide layer may include transparent oxide with low reflectivity, such as MoTaOx. In some embodiments, the third shading layer BM3 may include a non-conductive material, such as black resin, graphite, or the like.

With reference to FIG. 5A and FIG. 5D to FIG. 5E, in this embodiment, the fourth planarization layer PL4 is located between the second shading layer BM2 and the third insulating layer BP3, and the third insulating layer BP3 is located between the fourth planarization layer PL4 and the fifth planarization layer PL5. In some embodiments, the fingerprint sensing device 100D may further include an infrared shading layer IR, and the infrared shading layer IR may be located between the third insulating layer BP3 and the fifth planarization layer PL5. The fourth planarization layer PL4, the third insulating layer BP3, the infrared shading layer IR, and the fifth planarization layer PL5 may extend from the sensing area SA to the peripheral area PA through the operation area MA.

A material of the fourth planarization layer PL4 and the fifth planarization layer PL5 may include an organic material, such as an acrylic material, a siloxane material, a polyimide material, an epoxy resin material, or a stacked layer containing the above materials, which should however not be construed as a limitation in the disclosure. A material of the third insulating layer BP3 and the fourth insulating layer BP4 may include an inorganic material, such as silicon oxide, silicon nitride, silicon oxynitride, or a stacked layer containing the above materials, which should however not be construed as a limitation in the disclosure. The infrared shading layer IR may block infrared rays from entry to avoid damages to the fingerprint image under strong ambient light. A material of the infrared shading layer IR includes, for instance, green photoresist.

In this embodiment, the fourth insulating layer BP4 may extend into the fourth trench T4 and completely cover sidewalls of the fourth planarization layer PL4, the third insulating layer BP3, the infrared shading layer IR, and the fifth planarization layer PL5 to prevent moisture from entering the fourth planarization layer PL4 and the fifth planarization layer PL5. The fourth opening OP4 at least exposes a portion of the second shading layer BM2 in the third trench T3, so that the third shading layer BM3 is in contact with the second shading layer BM2 through the fourth opening OP4.

Figure 6A:
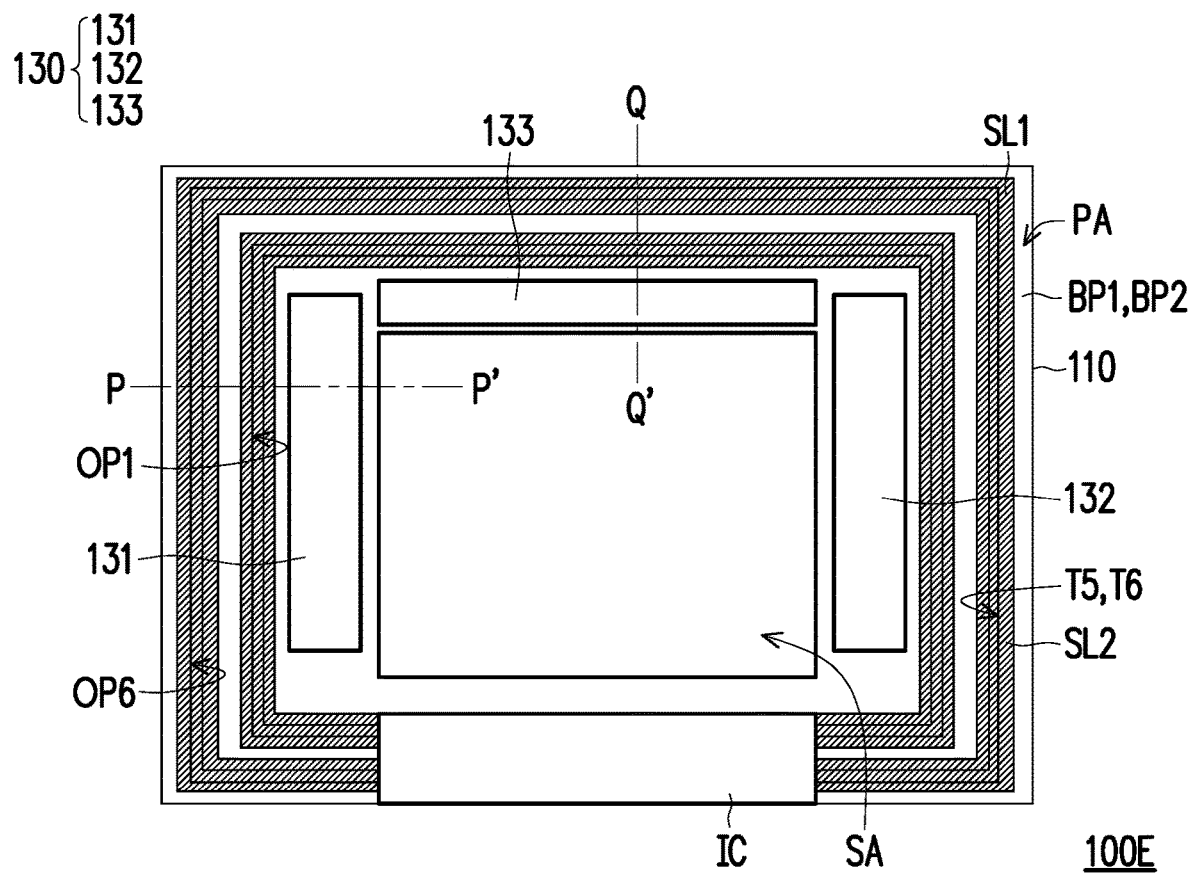
FIG. 6A is a schematic top view of a fingerprint sensing device 100E according to an embodiment of the disclosure.

FIG. 6A is a schematic top view of a fingerprint sensing device 100E according to an embodiment of the disclosure. FIG. 6B is a schematic cross-sectional view taken along a sectional line P-P' in FIG. 6A. FIG. 6C is a schematic cross-sectional view taken along a sectional line Q-Q' in FIG. 6A. For clear and concise illustration, the first planarization layer PL1, the second planarization layer PL2, the first shading layer BM1, the third planarization layer PL3, and the second shading layer BM2 are omitted in FIG. 6A. With reference to FIG. 6A to FIG. 6C, the way to implement each element and each film layer of the fingerprint sensing device 100E is further explained, and the reference numbers and related content provided in the embodiments shown in FIG. 1A to FIG. 1F are also applied hereinafter, which should however not be construed as a limitation in the disclosure.

The difference between the structure of the fingerprint sensing device 100 shown in FIG. 1A to FIG. 1F and the structure of the fingerprint sensing device 100E shown in FIG. 6A to FIG. 6C lies in that the fingerprint sensing device 100E further includes a second signal line SL2, and the fingerprint sensing device 100E further includes a third planarization layer PL3, a second insulating layer BP2, and a second shading layer BM2 sequentially on the first shading layer BM1. The first signal line SL1 is located between the second signal line SL2 and the operation element 130. The first planarization layer PL1 and the second planarization layer PL2 further have a fifth trench T5, and the fifth trench T5 overlaps the second signal line SL2. The first insulating layer BP1 further has a fifth opening OP5, and the fifth opening OP5 is located in the fifth trench T5. The third planarization layer PL3 has a sixth trench T6, and the sixth trench T6 overlaps the fifth trench T5. The second insulating layer BP2 has a sixth opening OP6, and the sixth opening OP6 is located in the fifth opening OP5. The second shading layer BM2 is connected to the second signal line SL2 through the sixth opening OP6.

In this embodiment, a material of the second shading layer BM2 may include a shading material, such as metal, black resin, graphite, or a stacked layer containing the above-mentioned shading materials. For instance, in some embodiments, the second shading layer BM2 may include a stacked layer of a metal layer and a transparent oxide layer, a material of the metal layer may include metal with good conductivity, such as aluminum, molybdenum, titanium, or a stacked layer containing said metal, and a material of the transparent oxide layer may include transparent oxide with low reflectivity, such as MoTaOx. In some embodiments, the second shading layer BM2 may include a non-conductive material, such as black resin, graphite, or the like.

In this embodiment, the second signal line SL2 may be a grounded line, which should however not be construed as a limitation in the disclosure. In some embodiments, the second signal line SL2 may also be a direct current power line with a strong voltage, which may be determined according to actual design requirements. A material of the second signal line SL2 may be metal or alloy with good conductivity, such as gold, silver, copper, aluminum, titanium, molybdenum, or a combination thereof, which should however not be construed as a limitation in the disclosure.

With reference to FIG. 6A to FIG. 6C, in this embodiment, the first insulating layer BP1 may first extend into the first trench T1 and then extend into the fifth trench T5; that is, the first insulating layer BP1 may completely cover the first planarization layer PL1 and the second planarization layer PL2. In addition, the first shading layer BM1 may extend into the first trench T1 to be connected to the first signal line SL1 without further extending to the fifth trench T5.

In this embodiment, the third planarization layer PL3 is located between the first shading layer BM1 and the second insulating layer BP2, and the second insulating layer BP2 is located between the third planarization layer PL3 and the second shading layer BM2. The third planarization layer PL3, the second insulating layer BP2, and the second shading layer BM2 may extend from the sensing area SA to the peripheral area PA through the operation area MA. A material of the third planarization layer PL3 may include an organic material, such as an acrylic material, a siloxane material, a polyimide material, an epoxy resin material, or a stacked layer containing the above materials, which should however not be construed as a limitation in the disclosure. A material of the second insulating layer BP2 may include an inorganic material, such as silicon oxide, silicon nitride, silicon oxynitride, or a stacked layer containing the above materials, which should however not be construed as a limitation in the disclosure.

The second insulating layer BP2 may extend into the sixth trench T6 and completely cover a sidewall of the third planarization layer PL3 to prevent moisture from entering the third planarization layer PL3. In some embodiments, the second insulating layer BP2 may also extend into the fifth opening OP5 along an upper surface of the first insulating layer BP1. In addition, the sixth opening OP6 of the second insulating layer BP2 may overlap the fifth opening OP5 and expose the second signal line SL2. Therefore, the second shading layer BM2 may be connected to the second signal line SL2 through the sixth opening OP6. When the second shading layer BM2 is made of a conductive material, the second shading layer BM2 may discharge static electricity through the second signal line SL2, so as to achieve the anti-ESD effect on the fingerprint sensor device 100E.

In this embodiment, at least one of the first shading layer BM1 and the second shading layer BM2 may include a stacked layer of a metal layer and a transparent oxide layer, wherein the metal layer may be located between the first insulating layer BP1 or the second insulating layer BP2 and the transparent oxide layer. A material of the metal layer may include metal with good conductivity, such as aluminum, molybdenum, titanium, and so on. In some embodiments, the metal layer may also a single-layer structure or a multi-layer structure, and the multi-layer structure may be a stacked layer containing any two or more layers of the above-mentioned conductive metal. The variations and combinations may differ according to actual needs. For instance, the metal layer may include the titanium layer, the aluminum layer, and the titanium layer that are sequentially stacked or the molybdenum layer, the aluminum layer, and the molybdenum layer that are sequentially stacked, which should however not be construed as a limitation in the disclosure. A material of the transparent oxide layer may include transparent oxide with low reflectivity, such as MoTaOx, which should however not be construed as a limitation in the disclosure.

Figure 7:
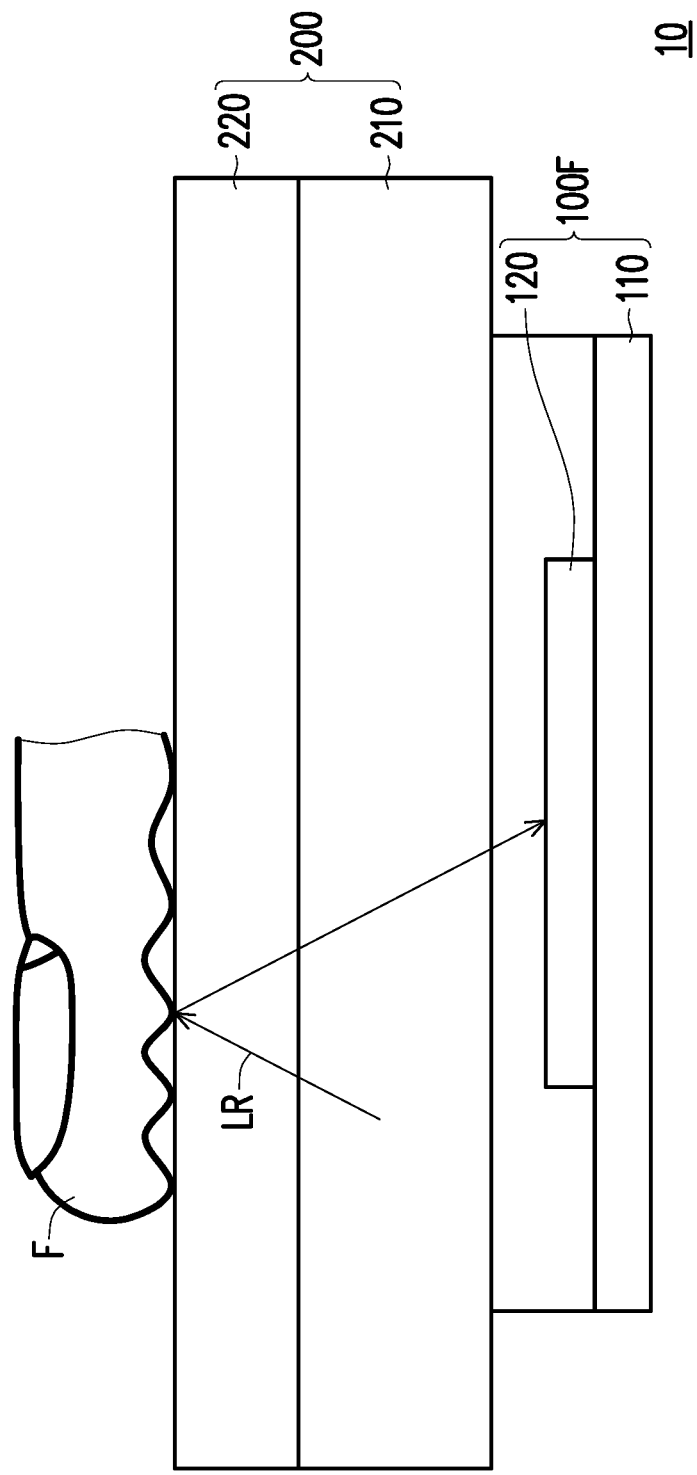
FIG. 7 is a schematic cross-sectional view of a display device 10 according to an embodiment of the disclosure.

FIG. 7 is a schematic cross-sectional view of a display device 10 according to an embodiment of the disclosure. With reference to FIG. 7, the way to implement each element and each film layer of the display device 10 is further explained, and the reference numbers and related content provided in the embodiments shown in FIG. 1A to FIG. 1F are also applied hereinafter, which should however not be construed as a limitation in the disclosure.

The display device 10 includes a fingerprint sensing device 100F and a display device 200, wherein the fingerprint sensing device 100F is adapted to the display device 200 to provide the display device 10 with a fingerprint recognition function. The structure of the fingerprint sensing device 100F may be similar to the fingerprint sensing devices 100, 100A, 100B, 100C, 100D, and 100E described in the previous embodiments. Therefore, the fingerprint sensing device 100F may have achieved good anti-moisture and anti-ESD functions.

In some embodiments, the fingerprint sensing device 100F may be disposed on the rear side of the display device 200, so that the sensing element 120 provided in the previous embodiments may be located between the display device 200 and the substrate 110, which should however not be construed as a limitation in the disclosure. The display device 200 may include, for instance, a pixel array substrate 210 and a cover substrate 220, and the pixel array substrate 210 may be located between the fingerprint sensing device 100F and the cover substrate 220.

In this embodiment, when a finger F approaches the cover substrate 220, a light beam LR emitted from the pixel array substrate 210 may be reflected by the finger F to the sensing element 120 in the fingerprint sensing device 100F. Since the through holes V1, the through holes V2, or the microlens structure ML may achieve light collimation, reflected light generated by the light beam LR reflected by the finger F may be collimated and enter into the sensing element 120, so that the sensing element 120 may sense a clear finger ridge/valley signal and then obtain a fingerprint image with good quality.

To sum up, in the fingerprint sensor provided in one or more embodiments of the disclosure, the trench is applied to isolate the planarization layer, and the stacked layer structure (composed of the organic material/the inorganic material) of the planarization layer and the insulating layer serve to block the moisture, whereby the organic material may be prevented from absorbing the moisture, and thus the functionality of the operation element is not affected by the moisture. In addition, the shading layer connected to the signal line may discharge static electricity, so as to achieve the anti-ESD effect on the fingerprint sensing device.

It will be apparent to those skilled in the art that various modifications and variations can be made to the disclosed embodiment without departing from the scope or spirit of the disclosure. In view of the foregoing, it is intended that the disclosure covers modifications and variations provided that they fall within the scope of the following claims and their equivalents.

What is claimed is:

1. A fingerprint sensing device, comprising a sensing area, an operation area, and a peripheral area, wherein the operation area is located between the sensing area and the peripheral area, and the fingerprint sensing device comprises:
a substrate;
a sensing element, located at the sensing area;
an operation element, located at the operation area;
a first signal line, located at the peripheral area;
a first planarization layer, located on the substrate and having a first trench, wherein the first trench overlaps the first signal line;
a first insulating layer, located on the first planarization layer and in the first trench, the first insulating layer having a first opening, wherein the first opening is located in the first trench; and
a first shading layer, located on the first insulating layer and connected to the first signal line through the first opening,
wherein the first shading layer further comprises a third planarization layer, a second insulating layer, and a second shading layer sequentially, wherein
the third planarization layer has a third trench overlapping the first trench,
the second insulating layer has a third opening located in the third trench, and
the second shading layer is connected to the first shading layer through the third opening,
wherein the second shading layer further comprises a fourth planarization layer, a third insulating layer, a fifth planarization layer, a fourth insulating layer, a third shading layer, and a microlens structure sequentially, wherein
the fourth planarization layer, the third insulating layer, and the fifth planarization layer have a fourth trench overlapping the third trench,
the fourth insulating layer has a fourth opening located in the fourth trench, and
the third shading layer is connected to the second shading layer through the fourth opening.

2. The fingerprint sensing device according to claim 1, wherein the third shading layer has a third through hole, and the microlens structure is disposed in the third through hole.

3. The fingerprint sensing device according to claim 1, wherein the third shading layer comprises a metal layer and a transparent oxide layer.

4. A fingerprint sensing device, comprising a sensing area, an operation area, and a peripheral area, wherein the operation area is located between the sensing area and the peripheral area, and the fingerprint sensing device comprises:
a substrate;
a sensing element, located at the sensing area;
an operation element, located at the operation area;
a first signal line, located at the peripheral area;
a first planarization layer, located on the substrate and having a first trench, wherein the first trench overlaps the first signal line;

a first insulating layer, located on the first planarization layer and in the first trench, the first insulating layer having a first opening, wherein the first opening is located in the first trench;

a first shading layer, located on the first insulating layer and connected to the first signal line through the first opening; and a second signal line and a third planarization layer, a second insulating layer, and a second shading layer sequentially on the first shading layer, wherein the first signal line is located between the second signal line and the operation element, the first planarization layer further has a fifth trench overlapping the second signal line, the first insulating layer further has a fifth opening located in the fifth trench, the third planarization layer has a sixth trench overlapping the fifth trench, the second insulating layer has a sixth opening located in the fifth opening, and the second shading layer is connected to the second signal line through the sixth opening.

5. The fingerprint sensing device according to claim 4, wherein the first shading layer comprises a metal layer and a transparent oxide layer.

6. The fingerprint sensing device according to claim 4, wherein the second shading layer comprises a metal layer and a transparent oxide layer.

7. The fingerprint sensing device according to claim 4, wherein the second signal line is a grounded line or a direct current power line.

* * * * *